(12) United States Patent
Honda

(10) Patent No.: US 9,876,119 B2
(45) Date of Patent: Jan. 23, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Tatsuya Honda, Isehara (JP)

(73) Assignee: Semiconductor Energy Laboratory Co., Ltd., Kanagawa-ken (JP)

(\*) Notice: Subject to any disclaimer, the term of this patent is extended or adjusted under 35 U.S.C. 154(b) by 88 days.

(21) Appl. No.: 15/066,339

(22) Filed: Mar. 10, 2016

(65) Prior Publication Data

US 2016/0190332 A1 Jun. 30, 2016

Related U.S. Application Data

(63) Continuation of application No. 13/632,525, filed on Oct. 1, 2012, now abandoned.

(30) Foreign Application Priority Data

Oct. 5, 2011 (JP) ................................. 2011-221195

(51) Int. Cl.
*H01L 21/00* (2006.01)
*H01L 29/10* (2006.01)
(Continued)

(52) U.S. Cl.
CPC ........ *H01L 29/7869* (2013.01); *H01L 21/443* (2013.01); *H01L 29/66969* (2013.01); *H01L 29/78618* (2013.01); *H01L 29/78696* (2013.01)

(58) Field of Classification Search
CPC . H01L 29/7869; H01L 21/443; H01L 29/669; H01L 29/78696
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Alonzo Chambliss
(74) *Attorney, Agent, or Firm* — Robinson Intellectual Property Law Office; Eric J. Robinson

(57) ABSTRACT

An oxide semiconductor film is formed over a substrate, a film of a semiconductor other than an oxide semiconductor is formed over the oxide semiconductor film, and then an oxygen atom in the oxide semiconductor film and an atom in the film of a semiconductor are bonded to each other at an interface between the oxide semiconductor film and the film of a semiconductor. Accordingly, the interface can be made continuous. Further, oxygen released from the oxide semiconductor film is diffused into the film of a semiconductor, so that the film of a semiconductor can be oxidized to form an insulating film. The use of the gate insulating film thus formed leads to a reduction in interface scattering of electrons at the interface between the oxide semiconductor film and the gate insulating film; so that a transistor with excellent electric characteristics can be manufactured.

14 Claims, 19 Drawing Sheets

(51) Int. Cl.
  *H01L 29/786* (2006.01)
  *H01L 21/443* (2006.01)
  *H01L 29/66* (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,639,246 B2 * | 10/2003 | Honda | H01L 29/6675 257/347 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,994,500 B2 | 8/2011 | Kim et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0047785 A1 * | 3/2003 | Kawasaki | H01L 29/66969 257/350 |
| 2003/0089911 A1 | 5/2003 | Kasahara et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0254569 A1 | 10/2008 | Hoffman et al. | |
| 2008/0258139 A1 | 10/2008 | Ito et al. | |
| 2008/0258143 A1 | 10/2008 | Kim et al. | |
| 2008/0299702 A1 * | 12/2008 | Son | H01L 29/7869 438/104 |
| 2009/0065771 A1 * | 3/2009 | Iwasaki | H01L 29/78618 257/43 |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0321731 A1 | 12/2009 | Jeong et al. | |
| 2009/0321732 A1 * | 12/2009 | Kim | H01L 29/78606 257/43 |
| 2010/0038641 A1 | 2/2010 | Imai | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0207117 A1 * | 8/2010 | Sakata | H01L 29/7869 257/43 |
| 2010/0207118 A1 | 8/2010 | Sakata et al. | |
| 2010/0207119 A1 | 8/2010 | Sakata et al. | |
| 2010/0213460 A1 * | 8/2010 | Kondo | H01L 29/45 257/43 |
| 2010/0320458 A1 | 12/2010 | Umeda et al. | |
| 2010/0320459 A1 | 12/2010 | Umeda et al. | |
| 2011/0079778 A1 * | 4/2011 | Yamazaki | H01L 21/02554 257/43 |
| 2011/0193083 A1 | 8/2011 | Kim et al. | |
| 2011/0215328 A1 | 9/2011 | Morosawa et al. | |
| 2012/0097942 A1 | 4/2012 | Imoto et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 2000-044236 A | 2/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 | 2/2010 |
| JP | 2010-067954 A | 3/2010 |

(56) References Cited

FOREIGN PATENT DOCUMENTS

| JP | 2010-177431 A | 8/2010 |
|---|---|---|
| JP | 2010-219094 A | 9/2010 |
| JP | 4571221 | 10/2010 |
| WO | WO-2004/114391 | 12/2004 |
| WO | WO-2008/133345 | 11/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer" Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 in. QVGA Amoled Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C." Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nakayama et al., "17a-TI-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Du Ahn.B et al., "Comparison of the effects of Ar and H2 plasmas on the performance of homojunctioned amorphous indium gallium zinc oxide thin film transistors", Appl. Phys. Lett. (Applied Physics Letters) , 2008, vol. 93, No. 20, pp. 203506-1-203506-3.

Grove.A et al., "Redistribution of Acceptor and Donor Impurities during Thermal Oxidation of Silicon", J. Appl. Phys. (Journal of Applied Physics) , Sep. 1, 1964, vol. 35, No. 9, pp. 2695-2701.

Huang.S et al., "Device characteristics of amorphous indium gallium zinc oxide thin film transistors with ammonia incorporation", Solid-State Electronics, Jul. 1, 2011, vol. 61, No. 1, pp. 96-99, Elsevier.

* cited by examiner deposited silicon oxide film silicon oxide

IGZO film quartz substrate silicon oxide amorphous silicon

IGZO film quartz

SEMICONDUCTOR DEVICE AND MANUFACTURING METHOD THEREOF

BACKGROUND OF THE INVENTION

1. Field of the Invention

The present invention relates to a semiconductor device including a semiconductor element such as a transistor which includes an oxide semiconductor, and a method for manufacturing the semiconductor device.

Note that a semiconductor device in this specification means all devices that can function by utilizing the semiconductor characteristics, and all of electronic optical devices, display devices and electronic appliances fall within the category of the semiconductor device.

2. Description of the Related Art

In recent years, a technique in which transistors are manufactured using an oxide semiconductor and used in electronic appliances such as electronic devices or optical devices has attracted attention. For example, a technique in which a transistor is manufactured using zinc oxide or In—Ga—Zn—O-based oxide as an oxide semiconductor and used for a switching element of a pixel of a display device, or the like is disclosed in Patent Document 1 and Patent Document 2.

A transistor including an oxide semiconductor is expected to considerably improve performance of a display device because such a transistor has higher field-effect mobility than a transistor including amorphous silicon.

REFERENCE

[Patent Document 1] Japanese Published Patent Application No. 2007-123861
[Patent Document 2] Japanese Published Patent Application No. 2007-096055

SUMMARY OF THE INVENTION

In the case where interfacial bonding between an oxide semiconductor film and a gate insulating film is insufficient and an oxide semiconductor film and a gate insulating film are discrete at the interface therebetween, however, interface states are formed. Therefore, when carriers are trapped in the interface states, space charge is generated at the interface between the oxide semiconductor film and the gate insulating film. Consequently, interface scattering of the carriers (electrons) occurs, which causes degradation of electric characteristics such as field-effect mobility. Further, a change in operating point or threshold voltage of the transistor is caused.

In view of the above problems, one object is to provide a transistor with excellent electric characteristics by reducing interface scattering of electrons at an interface between an oxide semiconductor film and a gate insulating film.

A semiconductor device of one embodiment of the present invention can be manufactured in the following manner.

An oxide semiconductor film is formed over a substrate, a film of a semiconductor other than an oxide semiconductor is formed over the oxide semiconductor film, and then heat treatment is performed, whereby an oxygen atom in the oxide semiconductor film and an atom in the film of a semiconductor other than an oxide semiconductor are bonded to each other at the interface between the oxide semiconductor film and the film of a semiconductor other than an oxide semiconductor. Accordingly, a structure of the oxide semiconductor film and a structure of the film of a semiconductor other than an oxide semiconductor can be made continuous at the interface therebetween. Further, oxygen released from the oxide semiconductor film is diffused into the film of a semiconductor other than an oxide semiconductor, so that the film of a semiconductor other than an oxide semiconductor can be oxidized to form an insulating film (also referred to as an oxide insulating film). The insulating film can be used as a gate insulating film.

As well as oxygen in the oxide semiconductor film, an oxygen atom bonded to one or more metal atoms in the oxide semiconductor film is released to be diffused into the film of a semiconductor other than an oxide semiconductor. The metal atom is transferred to the insulating film formed by oxidation of the film of a semiconductor other than an oxide semiconductor, so that a mixed region where an element in the oxide semiconductor film and an element in the insulating film are mixed is formed. The mixed region exists in the interface region of the insulating film in contact with the oxide semiconductor film.

The film of a semiconductor other than an oxide semiconductor is preferably formed to a thickness in the range of greater than or equal to 2 nm to less than or equal to 5 nm. When the thickness of the film of a semiconductor other than an oxide semiconductor is less than 2 nm, island-shaped portions of the film of a semiconductor other than an oxide semiconductor are scattered and thus the film of a semiconductor other than an oxide semiconductor cannot have an even thickness. When the thickness of the film of a semiconductor other than an oxide semiconductor is greater than 5 nm, it is difficult to sufficiently oxidize the film of a semiconductor other than an oxide semiconductor through heat treatment, to form an insulating film.

After the heat treatment, the oxide semiconductor film and the insulating film are processed into island shapes. Then, another insulating film may be formed over the island-shaped insulating film and used as a gate insulating film. For the insulating film formed over the island-shaped insulating film, a material such as silicon oxide, silicon oxynitride, silicon nitride oxide, silicon nitride, aluminum oxide, hafnium oxide, gallium oxide, or a Ga—Zn-based metal oxide can be used.

After that, a gate electrode is formed over the gate insulating film and then, source and drain electrodes are formed in contact with the oxide semiconductor film.

The above method allows interfacial bonding between the oxide semiconductor film and the insulating film, so that the structure of the oxide semiconductor film and the structure of the insulating film can be made continuous at the interface therebetween. Accordingly, the number of interface states at the interface between the oxide semiconductor film and the insulating film can be reduced, leading to a reduction in generation of space charge. Consequently, scattering of carriers (electrons) at the interface between the oxide semiconductor film and the insulating film can be reduced, leading to an increase in field-effect mobility of a transistor. Further, a change in operating point or threshold voltage of the transistor can be reduced.

The film of a semiconductor other than an oxide semiconductor can be formed using silicon, for example. Instead of the film of a semiconductor other than an oxide semiconductor, a metal film which is insulated by being oxidized may be used. The metal film can be formed using any one of aluminum (Al), zirconium (Zr), hafnium (Hf), and tantalum (Ta). The metal film is formed to a thickness in the range of greater than or equal to 2 nm to less than or equal to 5 nm over the oxide semiconductor film and heat treatment is performed, whereby an oxygen atom in the oxide semiconductor film and an atom in the metal film are bonded to each other at the interface between the oxide semiconductor film and the metal film. Accordingly, the structure of the oxide semiconductor film and the structure of the metal film can be made continuous at the interface therebetween. Further, oxygen released from the oxide semiconductor film is diffused into the metal film, so that the metal film can be oxidized to form an insulating film (metal oxide film). The insulating film can be used as a gate insulating film.

Further, an oxide insulating film from which oxygen is partly released by heating may be formed between the substrate and the oxide semiconductor film. The oxide insulating film allows oxygen contained therein to be partly released by heating to be diffused into the oxide semiconductor film. Consequently, the vacancy of oxygen caused by oxygen diffusion from the oxide semiconductor film into the film of a semiconductor other than an oxide semiconductor or the metal film can be compensated by oxygen released from the oxide insulating film.

A semiconductor device of one embodiment of the present invention has the following structure.

The semiconductor device of one embodiment of the present invention includes an oxide semiconductor film that is provided over a substrate, a gate electrode that overlaps with the oxide semiconductor film, a gate insulating film that is provided between the oxide semiconductor film and the gate electrode, and source and drain electrodes in contact with the oxide semiconductor film, and has, in the interface region of the gate insulating film in contact with the oxide semiconductor film, a mixed region where an element of the oxide semiconductor film and an element of the gate insulating film are mixed.

In the above structure, the oxide semiconductor film contains one or more elements selected from In, Ga, Sn, and Zn.

In the above structure, the gate insulating film is preferably any one of a silicon oxide film, an aluminum oxide film, a zirconium oxide film, a hafnium oxide film, and a tantalum oxide film.

In the above structure, the mixed region in the interface region of the insulating film in contact with the oxide semiconductor film has a thickness in the range of greater than or equal to 2 nm to less than or equal to 5 nm. The mixed region contains one or more elements selected from In, Ga, Sn, and Zn.

A semiconductor device of one embodiment of the present invention includes an oxide semiconductor film that is provided over a substrate, a gate electrode that overlaps with the oxide semiconductor film, a first gate insulating film and a second gate insulating film that are provided between the oxide semiconductor film and the gate electrode, and source and drain electrodes in contact with the oxide semiconductor film. The first gate insulating film in contact with the oxide semiconductor film contains an element of the oxide semiconductor film.

In the above structure, the oxide semiconductor film contains one or more elements selected from In, Ga, Sn, and Zn.

In the above structure, the first gate insulating film is preferably any one of a silicon oxide film, an aluminum oxide film, a zirconium oxide film, a hafnium oxide film, and a tantalum oxide film.

In the above structure, the first gate insulating film has a thickness in the range of greater than or equal to 2 nm to less than or equal to 5 nm. The first gate insulating film contains one or more elements selected from In, Ga, Sn, and Zn.

In the above structure, it is preferable that an oxide insulating film be further provided between the substrate and the oxide semiconductor film.

According to one embodiment of the present invention, the structure of the oxide semiconductor film and the structure of the gate insulating film can be made continuous at the interface therebetween. Accordingly, interface scattering of electrons can be reduced; thus, a transistor with excellent electronic characteristics such as field-effect mobility can be provided. Further, a transistor in which a change in operating point or threshold voltage is reduced can be provided.

DETAILED DESCRIPTION OF THE INVENTION

Figure 1A:
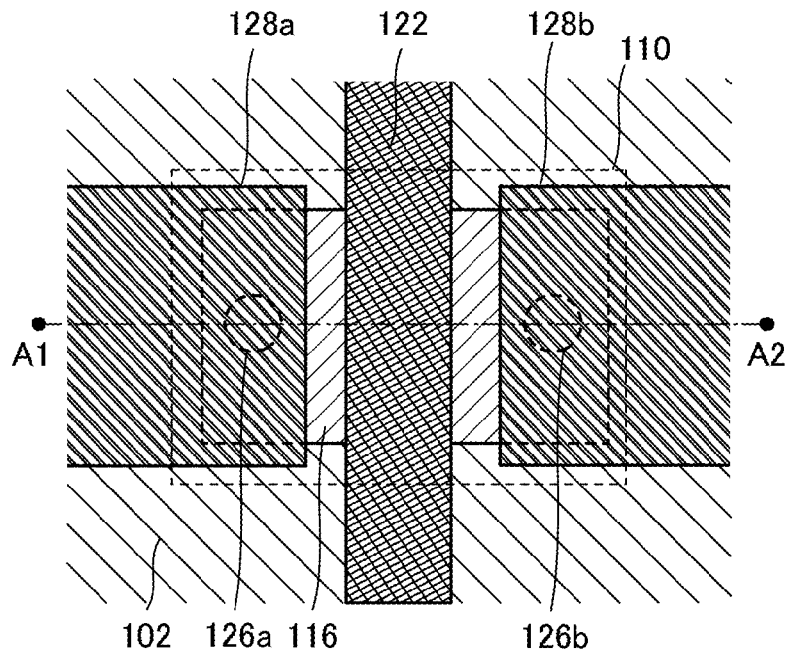
FIGS. 1A to 1C illustrate a semiconductor device of one embodiment.

Hereinafter, embodiments and an example of the invention disclosed in this specification and the like will be described in detail with reference to the accompanying drawings. However, the invention disclosed in this specification and the like is not limited to the description below, and it is easily understood by those skilled in the art that modes and details disclosed herein can be modified in various ways. Therefore, the invention disclosed in this specification and the like is not construed as being limited to the descriptions of the following embodiments and example.

Further, in the embodiments and the example, the same parts are denoted by the same reference numerals throughout the drawings. Note that the thickness, width, relative positional relation, and the like of components, i.e., a layer, a region, and the like, which are illustrated in the drawings are exaggerated for clarification of descriptions of the embodiments and example in some cases.

Note that the ordinal numbers such as "first" and "second" in this specification and the like are used for convenience and do not denote the order of steps and the stacking order of layers. In addition, the ordinal numbers in this specification and the like do not denote particular names which specify the present invention.

Embodiment 1

In this embodiment, a semiconductor device of one embodiment and a method for manufacturing the semiconductor device of one embodiment will be described with reference to FIGS. 1A to 1C, FIGS. 2A to 2E, and FIGS. 3A to 3E.

Figure 1B:
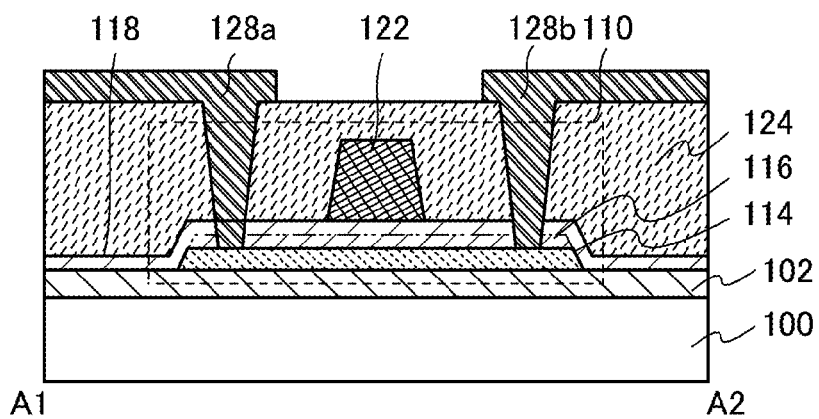
Figure 1C:
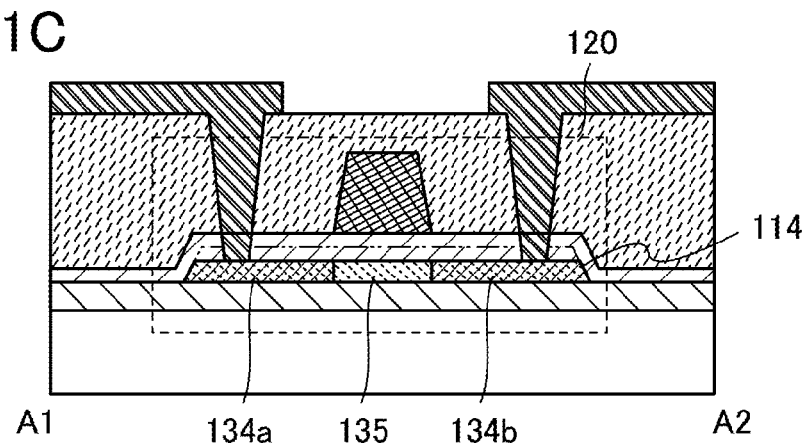

FIGS. 1A to 1C are a plan view and cross-sectional views of a transistor 110 as an example of a semiconductor device of one embodiment of the present invention. FIG. 1A is a plan view, and FIG. 1B is a cross-sectional view along A1-A2 of FIG. 1A. Note that in FIG. 1A, some components of the transistor 110 (e.g., a gate insulating film 118 and an interlayer insulating film 124) are omitted for simplicity.

The transistor 110 in FIGS. 1A and 1B includes an oxide semiconductor film 114 provided over the substrate 100; a gate insulating film 116 provided in contact with the oxide semiconductor film 114; a gate insulating film 118 provided so as to cover the gate insulating film 116; a gate electrode 122 provided over the gate insulating film 118; an insulating film 124 provided so as to cover the gate insulating film 118 and the gate electrode 122; and source and drain electrodes 128a and 128b in contact with the oxide semiconductor film 114 through contact holes 126a and 126b formed in the insulating film 124, the gate insulating film 118, and the gate insulating film 116. An insulating film 102 may be provided between the substrate 100 and the oxide semiconductor film 114.

Note that there is no particular limitation on a substrate that can be used as the substrate 100 as long as it has at least heat resistance to withstand later heat treatment. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100. Any of these substrates provided with a semiconductor element may be used as the substrate 100.

The semiconductor device may be manufactured using a flexible substrate as the substrate 100. To manufacture a flexible semiconductor device, the transistor 110 including the oxide semiconductor film 114 may be directly formed over a flexible substrate; or alternatively, the transistor 110 including the oxide semiconductor film 114 may be formed over a substrate and then separated and transferred to a flexible substrate. Note that in order to separate the transistor from the formation substrate and transfer it to the flexible substrate, a separation layer is preferably provided between the formation substrate and the transistor 110 including the oxide semiconductor film 114.

The insulating film 102 can be formed using silicon nitride, silicon nitride oxide, aluminum nitride, aluminum nitride oxide, silicon oxide, silicon oxynitride, gallium oxide, hafnium oxide, yttrium oxide, or the like.

The insulating film 102 is preferably formed using an oxide insulating film from which oxygen is partly released by heating. An oxide insulating film which contains oxygen in an amount exceeding the amount of oxygen in its stoichiometric composition is preferably used as the oxide insulating film from which oxygen is partly released by heating. Oxygen can be diffused from the oxide insulating film into the oxide semiconductor film by heat treatment in the state where the oxide insulating film is in contact with the oxide semiconductor film. Examples of the oxide insulating film from which oxygen is partly released by heating include a silicon oxide film, a silicon oxynitride film, a silicon nitride oxide film, a gallium oxide film, a hafnium oxide film, and an yttrium oxide film, and the like.

The thickness of the insulating film 102 is greater than or equal to 50 nm and less than or equal to 500 nm, preferably greater than or equal to 200 nm and less than or equal to 400 nm. In the case where the oxide insulating film from which oxygen is partly released by heating is used as the insulating film 102, an increase in thickness of the oxide insulating film leads to an increase in amount of oxygen released from the oxide insulating film.

Here, the "oxide insulating film from which oxygen is partly released by heating" means a film whose release amount of oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

Here, the measurement method of the amount of released oxygen converted into oxygen atoms in TDS analysis will be described below.

The total amount of released gas in TDS analysis is proportional to the integral value of the ion intensity. Then, the integral value is compared with that of a reference sample, whereby the total amount of the released gas can be calculated.

For example, the amount of the released oxygen molecules ($N_{O2}$) from a measured sample can be found according to the following Formula 1 with the TDS analysis results of a silicon wafer containing hydrogen at a predetermined density which is the standard sample and the TDS analysis results of an insulating film. Here, all gases having a mass number of 32 which are obtained in the TDS analysis are assumed to originate from an oxygen molecule. Note that $CH_3OH$, which is given as a gas having a mass number of 32, is not taken into consideration on the assumption that it is unlikely to be present. Further, an oxygen molecule containing an oxygen atom having a mass number of 17 or 18 which is an isotope of an oxygen atom is not taken into consideration either because the proportion of such a molecule in the natural world is minimal.

$$N_{O2} = \frac{N_{H2}}{S_{H2}} \times S_{O2} \times \alpha \qquad \text{[EQUATION 1]}$$

A value $N_{H2}$ is obtained by conversion of the amount of hydrogen molecules released from the standard sample into densities. A value $S_{H2}$ is the integral value of ion intensity when the standard sample is subjected to TDS analysis. Here, the reference value of the standard sample is set to $N_{H2}/S_{H2}$. A value $S_{O2}$ is the integral value of ion intensity when the insulating film is subjected to TDS analysis. α is a coefficient which influences the ion intensity in the TDS analysis. For details of Equation 1, refer to Japanese Published Patent Application No. H6-275697. Note that the amount of oxygen released from the above insulating film is measured with EMD-WA1000S/W, a thermal desorption spectroscopy apparatus produced by ESCO Ltd., using a silicon wafer containing hydrogen atoms at $1 \times 10^{16}$ atoms/cm$^3$ as the standard sample.

Further, in the TDS analysis, oxygen is partly detected as an oxygen atom. The ratio of oxygen molecules and oxygen atoms can be calculated from the ionization rate of the oxygen molecules. Note that, since the above α includes the ionization rate of oxygen molecules, the amount of the released oxygen atoms can also be estimated through the evaluation of the amount of the released oxygen molecules.

Note that $N_{O2}$ is the amount of released oxygen molecules. In the case of the insulating film, the amount of released oxygen converted into oxygen atoms is twice the amount of released oxygen molecules.

When oxygen released from the insulating film 102 is diffused into the oxide semiconductor film, the number of interface states between the insulating film 102 and the oxide semiconductor film 114 can be reduced. As a result, charge or the like which may be produced due to the operation of a transistor, or the like can be prevented from being trapped at the interface between the insulating film 102 and the oxide semiconductor film 114. Thus, the field-effect mobility of the transistor can be improved. In addition, variation and a change in the threshold voltage can be reduced.

Further, in some cases, charge is generated due to oxygen vacancy in the oxide semiconductor. In general, part of oxygen vacancy in an oxide semiconductor serves as a donor to generate an electron, i.e., a carrier. Consequently, the threshold voltage of a transistor shifts in the negative direction. This tendency is remarkable in oxygen vacancy caused on the back channel side. Note that the term "back channel" in this specification and the like refers to the vicinity of an interface with the insulating film 102, in the oxide semiconductor film 114 in FIG. 1B. When oxygen is sufficiently supplied from the insulating film 102 to the oxide semiconductor film, oxygen vacancy in the oxide semiconductor film can be reduced. Accordingly, the threshold voltage of the transistor can be prevented from shifting in the negative direction.

The oxide semiconductor film 114 preferably contains at least indium (In) or zinc (Zn). In particular, In and Zn are preferably contained. As a stabilizer for reducing variation in electric characteristics of a transistor including the oxide, it is preferable that one or more selected from gallium (Ga), tin (Sn), hafnium (Hf), zirconium (Zr), and aluminum (Al) be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn and there is no particular limitation on the ratio of In, Ga, and Zn. The In—Ga—Z-based oxide may contain another metal element in addition to In, Ga, and Zn.

Note that one embodiment of the present invention is not limited thereto, and a material having appropriate composition depending on semiconductor characteristics (mobility, threshold, variation, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics.

Note that a metal oxide which can be used for the oxide semiconductor film 114 has an energy gap of 2 eV or more, preferably 2.5 eV or more, more preferably 3 eV or more. The use of such an oxide semiconductor having a wide energy gap leads to a reduction in off-state current of a transistor.

The oxide semiconductor film 114 is in a single crystal state, a polycrystalline state, an amorphous state, or the like.

The oxide semiconductor film 114 is preferably a c-axis aligned crystalline oxide semiconductor (CAAC-OS) film.

The CAAC-OS film is not completely single-crystalline nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and the crystal part in the CAAC-OS film is not clear. Further, with the TEM, a grain boundary in the CAAC-OS film is not found, which suggests that in the CAAC-OS film, a reduction in electron mobility due to the grain boundary is suppressed.

In each of the crystal parts included in the CAAC-OS film, c-axes are aligned in the direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among the crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, the distribution of the crystal parts does not necessarily have to be uniform. For example, in the formation process of the CAAC-OS film, in the case where crystal growth occurs from the surface side of the oxide semiconductor film, the proportion of the crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of the c-axis of the crystal portion is the direction parallel to a normal vector of the surface where the CAAC-OS film is formed or a normal vector of the surface of the CAAC-OS film. The crystal part is formed by film formation or by performing treatment for crystallization such as heat treatment after film formation.

The use of the CAAC-OS film in a transistor leads to a reduction in change in electric characteristics of the transistor due to irradiation with visible light or ultraviolet light. Thus, the transistor has high reliability.

Note that part of oxygen contained in the oxide semiconductor film may be substituted with nitrogen.

An oxide semiconductor in an amorphous state can have a flat surface relatively easily; thus, when a transistor is formed with the use of the oxide semiconductor, interface scattering can be reduced, and relatively high mobility can be obtained with relative ease. In an oxide semiconductor having crystallinity (or a crystal part), defects in the bulk can be further reduced and when the surface planarity of the oxide semiconductor is improved, mobility higher than that of an oxide semiconductor in an amorphous state can be obtained.

In order to improve the surface planarity of the oxide semiconductor film 114, the oxide semiconductor film is preferably formed over a flat surface. Specifically, the oxide semiconductor film may be formed over a surface with an average surface roughness ($R_a$) of less than or equal to 1 nm, preferably less than or equal to 0.3 nm, more preferably less than or equal to 0.1 nm.

Note that $R_a$ is obtained by expanding, into three dimensions, the arithmetic mean surface roughness defined by JIS B 0601: 2001 (ISO4287:1997) so that it can be applied to a curved surface, and $R_a$ can be expressed as an "average value of the absolute values of deviations from a reference surface to a specific surface" and is defined by Equation 2.

$$Ra = \frac{1}{S_0} \int_{y_1}^{y_2} \int_{x_1}^{x_2} |f(x, y) - Z_0| dx dy \quad \text{[EQUATION 2]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the x-y plane, and $Z_0$ represents the height of the reference surface (the average height of the specific surface). $R_a$ can be measured using an atomic force microscope (AFM).

An improvement in planarity of a surface of the oxide semiconductor film 114 leads to a reduction in unevenness of the oxide semiconductor film 114 at the interface with the gate insulating film 116. Accordingly, interface scattering of electrons at the interface between the oxide semiconductor film 114 and the gate insulating film 116 can be reduced, resulting in an increase in field-effect mobility of a transistor.

The thickness of the oxide semiconductor film 114 is greater than or equal to 1 nm and less than or equal to 50 nm, preferably greater than or equal to 1 nm and less than or equal to 30 nm, more preferably greater than or equal to 1 nm and less than or equal to 10 nm, still more preferably greater than or equal to 3 nm and less than or equal to 7 nm. When the oxide semiconductor film 114 has a thickness within the above range, a short-channel effect of the transistor can be suppressed.

When the oxide semiconductor film 114 contains an alkali metal or an alkaline earth metal, the alkali metal or the alkaline earth metal and an oxide semiconductor are bonded to each other, so that carriers are generated in some cases. The generation of the carriers increases the off-state current of a transistor. For this reason, the concentration of an alkali metal or an alkaline earth metal in the oxide semiconductor film 114 is lower than or equal to $1 \times 10^{18}$ atoms/cm$^3$, preferably lower than or equal to $2 \times 10^{16}$ atoms/cm$^3$.

Further, when the oxide semiconductor film 114 contains a large amount of hydrogen, the hydrogen and an oxide semiconductor are bonded to each other, so that part of the hydrogen serves as a donor and causes generation of an electron, i.e., a carrier. As a result, the threshold voltage of a transistor shifts in the negative direction. This is why the hydrogen concentration in the oxide semiconductor film 114 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. Note that the concentration of hydrogen in the oxide semiconductor film is measured by secondary ion mass spectrometry (SIMS).

In the oxide semiconductor film in which the concentration of hydrogen is sufficiently reduced and defect levels in an energy gap due to oxygen vacancy are reduced by supply of a sufficient amount of oxygen, the carrier density can be lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per unit channel width (1 μm)) at room temperature (25° C.) is less than or equal to 100 zA (1 zA (zeptoampere) is $1 \times 10^{-21}$ A), preferably less than or equal to 10 zA. Thus, the use of an oxide semiconductor from which impurities such as hydrogen are sufficiently reduced and to which a sufficient amount of oxygen is supplied allows formation of a transistor with extremely favorable off-state current characteristics.

Further, as in the case of a transistor 120 in FIG. 1C, the oxide semiconductor film 114 may be doped with a dopant to form a first region 135 and a pair of second regions 134a and 134b. When the oxide semiconductor film 114 is doped with a dopant with the use of the gate electrode 122 as a mask, in the oxide semiconductor film 114, the first region 135 is formed in a region overlapping with the gate electrode 122 and the pair of second regions 134a and 134b are formed so that the first region 135 is sandwiched therebetween.

The second regions 134a and 134b contain, as a dopant, at least one of boron, nitrogen, phosphorus, and arsenic. Alternatively, the second regions 134a and 134b contain, as a dopant, at least one of helium, neon, argon, krypton, and xenon. Still alternatively, hydrogen is contained as the dopant. Further alternatively, as the dopant, at least one of boron, nitrogen, phosphorus, and arsenic, at least one of helium, neon, argon, krypton, and xenon, and hydrogen may be contained in appropriate combination.

The concentration of the dopant in the second regions 134a and 134b is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Doping the second regions 134a and 134b with the dopant increases the carrier density or defects of the oxide semiconductor film 114. Thus, the conductivity of the second regions 134a and 134b can be higher than that of the first region 135 without any dopant. Note that when the dopant concentration is too high, the dopant inhibits carrier transfer, leading to lower conductivity of the second regions 134a and 134b.

The conductivity of the second regions 134a and 134b is preferably higher than or equal to 0.1 S/cm and lower than or equal to 1000 S/cm, preferably higher than or equal to 10 S/cm and lower than or equal to 1000 S/cm.

The first region 135 serves as a channel region. For this reason, the concentration of an alkali metal or an alkaline earth metal in the first region 135 is preferably lower than or equal to $1\times10^{18}$ atoms/cm$^3$, more preferably lower than or equal to $2\times10^{16}$ atoms/cm$^3$. Further, the hydrogen concentration in the first region 135 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further preferably lower than or equal to $1\times10^{16}$ atoms/cm$^3$.

The existence of the pair of second regions 134a and 134b containing the dopant in the oxide semiconductor film 114 can relieve an electric field applied to an end portion of the first region 135 serving as a channel region. Thus, a short-channel effect of the transistor can be suppressed.

The transistor 120 is the same as the transistor 110 except that the first region 135 and the second regions 134a and 134b are formed in the oxide semiconductor film 114. As for the top view of the transistor 120, refer to FIG. 1A.

Here, as the gate insulating film 116 in contact with the oxide semiconductor film 114, an insulating film (oxide insulating film) formed by oxidizing a semiconductor film other than an oxide semiconductor film is preferably used. In the case where a bond does not occur between the oxide semiconductor film 114 and the gate insulating film 116 in contact therewith and a structure of the oxide semiconductor film 114 and a structure of the gate insulating film 116 are discrete at the interface therebetween, interface states are formed at the interface between the oxide semiconductor film and the gate insulating film. Carrier trapping in the interface states causes generation of space charge at the interface. Consequently, interface scattering of the carriers (electrons) occurs, which causes degradation of electric characteristics such as field-effect mobility.

In view of the above, in one embodiment of the present invention, an oxide semiconductor film is formed, a film of a semiconductor other than an oxide semiconductor is formed over the oxide semiconductor film, and then heat treatment is performed, whereby an oxygen atom in the oxide semiconductor film and an atom in the film of a semiconductor other than an oxide semiconductor are bonded to each other at the interface between the oxide semiconductor film and the film of a semiconductor other than an oxide semiconductor. Accordingly, the structure of the oxide semiconductor film and the structure of the film of a semiconductor other than an oxide semiconductor can be made continuous at the interface therebetween. Further, oxygen released from the oxide semiconductor film is diffused into the film of a semiconductor other than an oxide semiconductor, so that the film of a semiconductor other than an oxide semiconductor can be oxidized to form an insulating film. The insulating film can be used as the gate insulating film 116.

As well as oxygen in the oxide semiconductor film, an oxygen atom bonded to a metal atom in the oxide semiconductor film is released to be diffused into the film of a semiconductor other than an oxide semiconductor. The metal atom is transferred to the insulating film (the gate insulating film 116 in FIGS. 1A to 1C) formed by oxidation of the film of a semiconductor other than an oxide semiconductor, so that a mixed region where an element in the oxide semiconductor film and an element in the insulating film are mixed is formed. The mixed region exists in the interface region of the insulating film in contact with the oxide semiconductor film. Such a metal element contained in the insulating film can be determined by energy dispersive X-ray spectroscopy (EDX).

In general, when the gate insulating film 116 and the gate insulating film 118 are formed using the same material (e.g., silicon oxide), an interface between the gate insulating film 116 and the gate insulating film 118 is not clear. However, the metal atom is contained in the gate insulating film 116 as described above; thus, the existence of the metal atom in the gate insulating film 116 can be recognized in an observation image obtained using a transmission electron microscope (TEM). Further, the interface between the gate insulating film 116 and the gate insulating film 118 can be observed. Because FIGS. 1A to 1C and FIGS. 2A to 2E illustrate an example in which silicon oxide is used for the gate insulating film 116 and the gate insulating film 118, a boundary between the gate insulating film 116 and the gate insulating film 118 is indicated by a chain double-dashed line.

The above method allows interfacial bonding between the oxide semiconductor film 114 and the gate insulating film 116, so that the structure of the oxide semiconductor film 114 and the structure of the gate insulating film 116 can be made continuous at the interface therebetween. Accordingly, the number of interface states at the interface between the oxide semiconductor film 114 and the gate insulating film 116 can be reduced, leading to a reduction in generation of space charge. Consequently, scattering of carriers (electrons) at the interface between the oxide semiconductor film 114 and the gate insulating film 116 can be reduced, leading to an increase in field-effect mobility of the transistor. Further, a change in operating point or threshold voltage of the transistor can be reduced.

As the film of a semiconductor other than an oxide semiconductor, for example, silicon can be used. Instead of the film of a semiconductor other than an oxide semiconductor, a film of any one of aluminum (Al), zirconium (Zr), hafnium (Hf), and tantalum (Ta) may be used. The film of the above metal is formed to a thickness in the range of greater than or equal to 2 nm to less than or equal to 5 nm over the oxide semiconductor film and heat treatment is performed, whereby an oxygen atom in the oxide semiconductor film and an atom in the metal film are bonded to each other at the interface between the oxide semiconductor film and the metal film. Accordingly, the structure of the oxide semiconductor film and the structure of the metal film can be made continuous at the interface therebetween. Further, oxygen released from the oxide semiconductor film is diffused into the metal film, so that the metal film can be oxidized to form an insulating film (metal oxide film). The insulating film (film of aluminum oxide, zirconium oxide, hafnium oxide, or tantalum oxide) can be used as the gate insulating film 116.

The gate insulating film 118 can be formed using, for example, silicon oxide, silicon oxynitride, silicon nitride oxide, silicon nitride, aluminum oxide, hafnium oxide, gallium oxide, a Ga—Zn-based metal oxide, or the like. Note that the gate insulating film 116 and the gate insulating film 118 can be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide. The use of such a high-k material makes it possible to reduce gate leakage current even when the thickness of the gate insulating film is small.

The thickness of the gate insulating film 116 is preferably greater than or equal to 2 nm and less than or equal to 5 nm. The thickness of the gate insulating film 118 is preferably greater than or equal to 5 nm and less than or equal to 300 nm, more preferably greater than or equal to 5 nm and less than or equal to 50 nm, still more preferably greater than or equal to 10 nm and less than or equal to 30 nm.

When an oxide insulating film from which part of oxygen is released by heating is used as the insulating film 102, part of oxygen contained in the oxide insulating film can be released to be diffused into the oxide semiconductor film in heat treatment. Consequently, the vacancy of oxygen caused by oxygen diffusion from the oxide semiconductor film into the film of a semiconductor other than an oxide semiconductor or the metal film can be compensated by oxygen released from the oxide insulating film.

The gate electrode 122 can be formed using a metal material selected from aluminum, chromium, copper, tantalum, titanium, molybdenum, and tungsten; an alloy material containing any of the above metal elements as a component; or an alloy material containing the above metal elements in combination; or the like. Further, one or more metal materials selected from manganese or zirconium may be used.

The gate electrode 122 may have a single-layer structure or a layered structure. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used. Alternatively, a stack in which a film of a metal selected from titanium, tantalum, tungsten, molybdenum, chromium, neodymium, and scandium, an alloy film of a plurality of the above metals in combination, or a nitride film of any of the above metals is stacked over an aluminum film may be used.

Alternatively, the gate electrode 122 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Still alternatively, the gate electrode 122 may have a layered structure of a light-transmitting conductive film and the above metal film described in this paragraph.

Further, an In—Ga—Zn—O film containing nitrogen, an In—Sn—O film containing nitrogen, an In—Zn—O film containing nitrogen, a Sn—O film containing nitrogen, an In—O film containing nitrogen, or a film of a metal nitride (e.g., InN or ZnN) may be provided between the gate electrode 122 and the gate insulating film 118. These films each have a work function of higher than or equal to 5 eV, preferably higher than or equal to 5.5 eV; thus, the threshold voltage of the transistor can be shifted in the positive direction. For example, in the case of using an In—Ga—Zn—O film containing nitrogen, an In—Ga—Zn—O film having at least a higher nitrogen concentration than the oxide semiconductor film 114, or specifically, an In—Ga—Zn—O film having a nitrogen concentration of 7 at. % or higher is preferably used.

The insulating film 124 can be formed using, silicon oxide, silicon oxynitride, silicon nitride oxide, silicon nitride, aluminum oxide, aluminum oxynitride, aluminum nitride oxide, aluminum nitride, or the like. The insulating film 124 may have a single-layer structure or a layered structure. An oxide insulating film from which part of oxygen is released by heating may be used as the insulating film 124 as in the case of the insulating film 102. Alternatively, an oxide insulating film which prevents hydrogen from externally entering the oxide semiconductor film 114 may be used as the insulating film 124. The oxide insulating film which prevents hydrogen from externally entering the oxide semiconductor film 114 can be formed using silicon nitride, silicon nitride oxide, aluminum nitride, aluminum nitride oxide, or the like. The use of the oxide insulating film which prevents hydrogen from externally entering the oxide semiconductor film 114 as the insulating film 124 permits prevention of entry of hydrogen into the oxide semiconductor film 114. When an oxide insulating film from which part of oxygen is released by heating is used as the gate insulating film 118 and the oxide insulating film which prevents hydrogen from externally entering the oxide semiconductor film 114 is used as the insulating film 124, outward diffusion of oxygen released from the gate insulating film 118 can be prevented.

Next, the method for forming the transistor illustrated in FIG. 1A to 1C will be described with reference to FIGS. 2A to 2E.

Figure 2A:
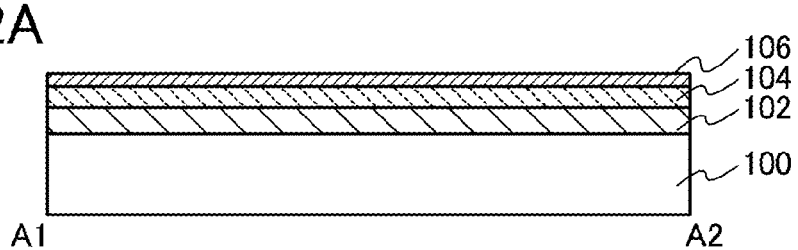
FIGS. 2A to 2E illustrate a semiconductor device and a method for manufacturing the semiconductor device of one embodiment.

First, the insulating film 102, an oxide semiconductor film 104, and a film 106 of a semiconductor other than an oxide semiconductor are formed over the substrate 100 (see FIG. 2A).

The insulating film 102 can be formed by a sputtering method, a CVD method, or the like. Note that an oxide insulating film from which part of oxygen is released by heating is preferably formed by a sputtering method.

When the oxide insulating film from which part of oxygen is released by heating is formed by a sputtering method, the oxygen concentration in a deposition gas is preferably high. The oxygen concentration in the deposition gas is preferably higher than or equal to 6% and lower than or equal to 100%. As the deposition gas, oxygen or a mixed gas of oxygen and a rare gas can be used.

In the case where a silicon oxide film is formed as a typical example of the oxide insulating film from which part of oxygen is released by heating, the silicon oxide film is preferably formed by a RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa), the high-frequency power is greater than or equal to 0.5 kW and less than or equal to 12 kW (preferably greater than or equal to 1 kW and less than or equal to 5 kW); and the proportion of $O_2$ to ($O_2$+Ar) in the deposition gas is greater than or equal to 1% and less than or equal to 100% (preferably greater than or equal to 6% and less than or equal to 100%). Note that a silicon target may be used as the target instead of the quartz (preferably synthetic quartz) target. In addition, oxygen alone may be used as the deposition gas.

Note that before the insulating film 102 is formed, hydrogen contained in the substrate 100 is preferably released by heat treatment or plasma treatment. Consequently, diffusion of hydrogen to the insulating film 102 and the oxide semiconductor film 104 in later heat treatment can be prevented. The heat treatment is performed at a temperature of higher than or equal to 100° C. and lower than the strain point of the substrate 100 in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

It is preferable to perform planarization treatment on a surface of the insulating film 102 because a surface of the oxide semiconductor film 104 to be formed later can be flat. As the planarization treatment, polishing treatment (such as a chemical mechanical polishing (CMP) method), dry etching treatment, or plasma treatment can be used. As the planarization treatment, polishing treatment, dry etching treatment, or plasma treatment may be performed plural times, or any of these treatments may be performed in combination. Further, the order of steps of such a combination is not particularly limited and may be set as appropriate in accordance with the unevenness of the surface of the insulating film 102.

As the plasma treatment, for example, reverse sputtering in which an argon gas is introduced and plasma is generated is preferably performed. The reverse sputtering refers to a method in which voltage is applied to the substrate side with the use of an RF power source in an argon atmosphere in order to generate plasma in the vicinity of the substrate so that a substrate surface is modified. Note that instead of an argon atmosphere, a nitrogen atmosphere, a helium atmosphere, an oxygen atmosphere, or the like may be used. When the reverse sputtering is performed, powdery substances (also referred to as particles or dust) which are attached to the surface of the insulating film 102 can be removed.

The planarization treatment is preferably performed on the surface of the insulating film 102 so that the average surface roughness ($R_a$) of the surface of the insulating film 102 is 1 nm or less, preferably 0.3 nm or less, more preferably 0.1 nm or less.

The oxide semiconductor film 104 can be formed by a sputtering method, a coating method, a printing method, a pulsed laser deposition method, or the like.

An example in which the oxide semiconductor film 104 is formed by a sputtering method will be described below.

In a process of forming the oxide semiconductor film 104, it is preferable to reduce entry of impurities such as hydrogen and water as much as possible in order to reduce entry of impurities such as hydrogen and water into the oxide semiconductor film 104.

Hydrogen contained in an oxide semiconductor reacts with an oxygen atom bonded to a metal atom to be water, and in addition, a vacancy is formed in a lattice from which the oxygen atom is released (or a portion from which the oxygen atom is released). Thus, the impurities including hydrogen are reduced as much as possible in the formation process of the oxide semiconductor film, whereby vacancies in the oxide semiconductor film can be reduced.

Before the oxide semiconductor film 104 is formed with a sputtering apparatus, it is preferable to perform steps in which a dummy substrate is put into the sputtering apparatus, and an oxide semiconductor film is formed over the dummy substrate so that hydrogen and moisture which are attached to a target surface or a deposition shield can be removed.

In order to reduce the hydrogen concentration, for example, a high-purity gas from which impurities such as hydrogen and water are removed is preferably supplied as a sputtering gas into a process chamber of the sputtering apparatus. As the sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. By increasing the proportion of oxygen, the oxygen content in the oxide semiconductor film 104 can be increased, and further, the oxide semiconductor film 104 is more likely to be crystallized.

Then, a sputtering gas from which impurities such as hydrogen and water are removed is introduced while moisture remaining in the process chamber is removed, whereby the hydrogen concentration in the oxide semiconductor film 104 can be reduced. For evacuation of the process chamber of the sputtering apparatus, a rough vacuum pump such as a dry pump and high vacuum pumps such as a sputter ion pump, a turbo molecular pump, and a cryopump may be used in appropriate combination. The turbo molecular pump has a high capability in removing a large-sized molecule, whereas it has a low capability in evacuating hydrogen or water. Hence, it is effective to use a combination of the turbo molecular pump and a cryopump having a high capability of removing water or a sputter ion pump having a high capability of removing hydrogen.

The hydrogen concentration in the oxide semiconductor film 104 can also be reduced by forming the oxide semiconductor film 104 while the substrate 100 is maintained at a high temperature. The heating temperature of the substrate 100 is preferably higher than or equal to 150° C. and lower than or equal to 450° C., more preferably higher than or equal to 200° C. and lower than or equal to 350° C. In addition, the oxide semiconductor film 104 can be made to be a CAAC-OS film when the substrate is heated at a temperature in the above range during formation of the oxide semiconductor film 104.

A CAAC-OS film can be formed by the following three types of methods. The first method is to form the oxide semiconductor film 104 at a temperature higher than or equal to 200° C. and lower than or equal to 450° C. The second method is to form a thin (several nanometers) oxide semiconductor film and then perform heat treatment at a temperature higher than or equal to 200° C. and lower than or equal to 700° C. The third method is to form a thin (several nanometers) oxide semiconductor film, perform heat treatment at a temperature higher than or equal to 200° C. and lower than or equal to 700° C., and form another oxide semiconductor film.

As the target, any of the following can be used: indium oxide; tin oxide; zinc oxide; a two-component metal oxides such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; three-component metal oxides such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and four-component metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

As an example of the target, a target of an In—Ga—Zn-based oxide with an atomic ratio of In:Ga:Zn=1:1:1, 4:2:3, 3:1:2, 1:1:2, 2:1:3, or 3:1:4 can be given. When the oxide semiconductor film 104 is formed using a target of an In—Ga—Zn-based oxide with the above atomic ratio, a polycrystal is easily formed. Further, a CAAC-OS film is easily formed. Note that an In—Ga—Zn-based oxide semiconductor is also referred to as IGZO.

For the formation of the CAAC-OS film, the following conditions are preferably used.

Reduction in amount of impurities entering the CAAC-OS film during the deposition can prevent the crystal state from being broken by the impurities. For example, the concentration of impurities (e.g., hydrogen, water, carbon dioxide, or nitrogen) existing in a deposition chamber is preferably reduced. Furthermore, the concentration of impurities in a deposition gas is preferably reduced. Specifically, a deposition gas whose dew point is −80° C. or lower, preferably −100° C. or lower is used.

When the substrate heating temperature during the deposition is increased, migration of sputtered particles occurs after the sputtered particles reach the substrate. Specifically, the substrate heating temperature during the deposition is higher than or equal to 100° C. and lower than or equal to 740° C., preferably higher than or equal to 200° C. and lower than or equal to 500° C. When the substrate heating temperature during the deposition is increased and the sputtered particles reach the substrate, migration occurs over the substrate, which facilitates crystal growth.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of a sputtering target, a polycrystalline In—Ga—Zn-based oxide target will be described below.

The polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Next, the film 106 of a semiconductor other than an oxide semiconductor is formed over the oxide semiconductor film 104 (see FIG. 2A). The film 106 of a semiconductor other than an oxide semiconductor can be formed using silicon, for example. The film 106 of a semiconductor other than an oxide semiconductor can be formed by a sputtering method, a CVD method, or the like.

The film 106 of a semiconductor other than an oxide semiconductor is preferably formed to a thickness in the range of greater than or equal to 2 nm to less than or equal to 5 nm. When the thickness of the film of a semiconductor other than an oxide semiconductor is less than 2 nm, island-shaped portions of the film of a semiconductor other than an oxide semiconductor are scattered and thus the film of a semiconductor other than an oxide semiconductor cannot have an even thickness. When the thickness of the film of a semiconductor other than an oxide semiconductor is greater than 5 nm, it is difficult to sufficiently oxidize the film of a semiconductor other than an oxide semiconductor through later heat treatment, to form an insulating film.

Instead of the film 106 of a semiconductor other than an oxide semiconductor, a metal film which is insulated by being oxidized may be used. The metal film can be formed using any one of aluminum (Al), zirconium (Zr), hafnium (Hf), and tantalum (Ta). When the metal film is used instead of the film of a semiconductor other than an oxide semiconductor, the metal film is formed to a thickness in the range of greater than or equal to 2 nm to less than or equal to 5 nm over the oxide semiconductor film 104 by a sputtering method.

In this embodiment, an amorphous silicon film is formed as the film 106 of a semiconductor other than an oxide semiconductor by a sputtering method.

Further, it is preferable to successively form the insulating film 102, the oxide semiconductor film 104, and the film 106 of a semiconductor other than an oxide semiconductor by a sputtering method.

Figure 2B:
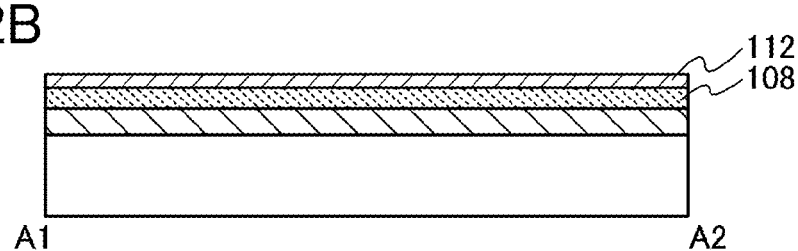

Then, the oxide semiconductor film 104 and the film 106 of a semiconductor other than an oxide semiconductor are subjected to heat treatment, whereby an oxide semiconductor film 108 and an insulating film 112 are formed (see FIG. 2B).

Through heat treatment, hydrogen or water contained in the oxide semiconductor film 104 can be removed (the oxide semiconductor film 104 can be dehydrated or dehydrogenated). Removal of hydrogen or water can prevent generation of electrons serving as carriers.

The temperature of the heat treatment is higher than or equal to 300° C. and lower than or equal to 700° C., or lower than the strain point of the substrate. The heat treatment can be performed under reduced pressure, a nitrogen atmosphere, or the like.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The temperature of the heat treatment is higher than or equal to 300° C. and lower than or equal to 700° C., or lower than the strain point of the substrate. The processing time is 3 minutes to 24 hours.

It is preferable that water, hydrogen, and the like be not contained in nitrogen or a rare gas such as helium, neon, or argon in the heating treatment. In addition, it is preferable that the purity of nitrogen or the rare gas such as helium, neon, or argon which is introduced into a heat treatment apparatus be set to 6N (99.9999%) or higher, preferably 7N (99.99999%) or higher (that is, the concentration of impurities is 1 ppm or lower, preferably 0.1 ppm or lower).

The heat treatment is performed with the oxide semiconductor film 104 and the film 106 of a semiconductor other than an oxide semiconductor in contact with each other, whereby an oxygen atom in the oxide semiconductor film 104 is bonded to an atom in the film of a semiconductor other than an oxide semiconductor at the interface between the oxide semiconductor film 104 and the film 106 of a semiconductor other than an oxide semiconductor. Accordingly, a structure of the oxide semiconductor film and a structure of the film of a semiconductor other than an oxide semiconductor can be made continuous at the interface therebetween. Further, when oxygen released from the oxide semiconductor film 104 is diffused into the film 106 of a semiconductor other than an oxide semiconductor, the film 106 of a semiconductor other than an oxide semiconductor can be oxidized to form the insulating film (oxide insulating film) 112.

As well as oxygen in the oxide semiconductor film 104, oxygen bonded to the metal atom in the oxide semiconductor film is released to be diffused into the film 106 of a semiconductor other than an oxide semiconductor. The insulating film formed by the oxidation of the film of a semiconductor other than an oxide semiconductor contains the metal atom; thus, a mixed region where an element of the oxide semiconductor film and an element of the insulating film are mixed is formed. The mixed region exists in the interface region of the insulating film in contact with the oxide semiconductor film.

In this embodiment, an amorphous silicon film is used as the film 106 of a semiconductor other than an oxide semiconductor. The heat treatment is performed with the oxide semiconductor film 104 and the amorphous silicon film in contact with each other, whereby the amorphous silicon film can be oxidized to form an oxide silicon film.

When a metal film is used instead of the film 106 of a semiconductor other than an oxide semiconductor, the heat treatment is performed with the oxide semiconductor film 104 and the metal film in contact with each other, whereby an oxygen atom in the oxide semiconductor film 104 is bonded to an atom in the metal film at the interface between the oxide semiconductor film 104 and the metal film. Accordingly, the structure of the oxide semiconductor film and a structure of the metal film can be made continuous at the interface therebetween. Further, when oxygen released from the oxide semiconductor film 104 is diffused into the metal film, the metal film can be oxidized to form an insulating film (an aluminum oxide film, a zirconium oxide film, a hafnium oxide film, or a tantalum oxide film).

Depending on a condition for the heating, hydrogen or water can be removed from the oxide semiconductor film 104, but at the same time, oxygen is released from the oxide semiconductor film 104 to an external portion (the film 106 of a semiconductor other than an oxide semiconductor) and thus oxygen vacancies remain in the oxide semiconductor film 104 in some cases. The oxygen vacancies particularly significantly affect a transistor having a minute structure in which the channel length has a submicron size, which causes a short-channel effect; accordingly, the threshold voltage shifts in the negative direction.

In view of the above, after the oxide semiconductor film 104 is heated through the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace while the heating temperature is maintained or gradually decreased. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is 1 ppm or lower, preferably 0.1 ppm or lower). The action of the oxygen gas or the dinitrogen monoxide gas supplies oxygen reduced at the same time as removal of hydrogen or water, whereby oxygen vacancies can be reduced.

When an oxide insulating film from which part of oxygen is released by heating is used as the insulating film 102, part of oxygen contained in the oxide insulating film can be released to be diffused into the oxide semiconductor film 104 in the heat treatment. Thus, the oxygen released from the oxide insulating film can also compensate for the vacancy of oxygen caused by oxygen diffusion from the oxide semiconductor film 104 into the film of a semiconductor other than an oxide semiconductor. When oxygen released from the insulating film 102 is diffused into the oxide semiconductor film 104, the number of interface states between the insulating film 102 and the oxide semiconductor film 104 can be reduced.

The heat treatment for the dehydration or dehydrogenation is preferably performed before the oxide semiconductor film is processed into an island shape because oxygen contained in the insulating film 102 can be prevented from being diffused outward by the heat treatment.

Note that the heat treatment for the dehydration or dehydrogenation can be performed a plurality of times. For example, the heat treatment for the dehydration or dehydrogenation may be performed after formation of the oxide semiconductor film 104 and before formation of the film 106 of a semiconductor other than an oxide semiconductor.

Through the heat treatment performed in such a manner, the oxide semiconductor film 108 and the insulating film 112 can be formed (see FIG. 2B).

Figure 2C:
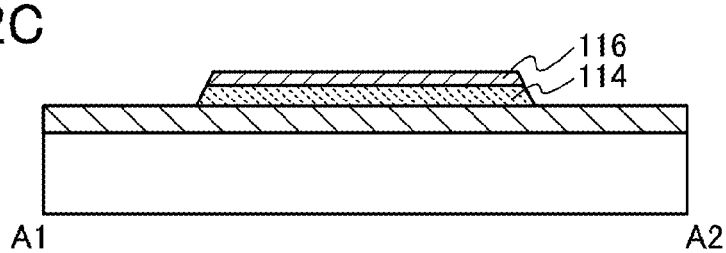

Then, a mask is formed over the insulating film 112 and etching is performed, whereby an island-shaped insulating film and the island-shaped oxide semiconductor film 114 are formed (see FIG. 2C). The island-shaped insulating film is used as the gate insulating film 116. A resist mask for forming the island-shaped gate insulating film 116 and the island-shaped oxide semiconductor film 114 can be formed by an ink-jet method. Formation of the resist mask by an ink-jet method needs no photomask; thus, manufacturing cost can be reduced. The insulating film 112 and the oxide semiconductor film 108 can be etched by dry etching, wet etching, or a combination of dry etching and wet etching.

Figure 2D:
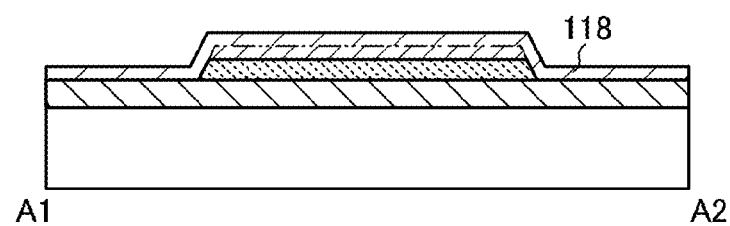

Then, the gate insulating film 118 is formed so as to cover the insulating film 102 and the gate insulating film 116 (see FIG. 2D).

The gate insulating film 118 can be formed by CVD method, a sputtering method, or the like. When an oxide insulating film from which part of oxygen is released by heating is used as the gate insulating film 118, a formation method of the insulating film 102 can be referred to.

Heat treatment may be performed after formation of the gate insulating film 118. In the case where the oxide insulating film from which part of oxygen is released by heating is formed as the gate insulating film 118 on a side surface of the oxide semiconductor film 114, part of oxygen can be released from the gate insulating film 118 to be diffused into the oxide semiconductor film 114. Accordingly, oxygen vacancies in the side surface of the oxide semiconductor film 114 can be reduced. Note that the heat treatment can be performed anytime after the formation of the gate insulating film 118.

Then, a conductive film used for formation of a gate electrode (as well as a wiring formed in the same layer as the gate electrode) is formed over the gate insulating film 118. After that, a mask is formed over the conductive film and etching is performed, whereby the gate electrode 122 is formed. The conductive film used for the gate electrode 122 can be formed by a sputtering method, a CVD method, a vapor deposition method, or the like. Note that the gate electrode 122 can be formed by a printing method or an ink-jet method.

Then, an insulating film 124 is formed over the gate insulating film 118 and the gate electrode 122. The insulating film 124 can be formed by a sputtering method, a CVD method, a coating method, a printing method, or the like.

Subsequently, part of the insulating film 124, the gate insulating film 118, and the gate insulating film 116 is removed so that contact holes 126a and 126b are formed. Then, a conductive film used for formation of source and drain electrodes (as well as a wiring formed in the same layer as the source and drain electrodes) is formed in and above the contact holes 126a and 126b. After that, a mask is formed over the conductive film and etching is performed, whereby the source electrode 128a and the drain electrode 128b are formed (see FIG. 2E). The conductive film used for the source electrode 128a and the drain electrode 128b can be formed by a sputtering method, a CVD method, a vapor deposition method, or the like.

Figure 2E:
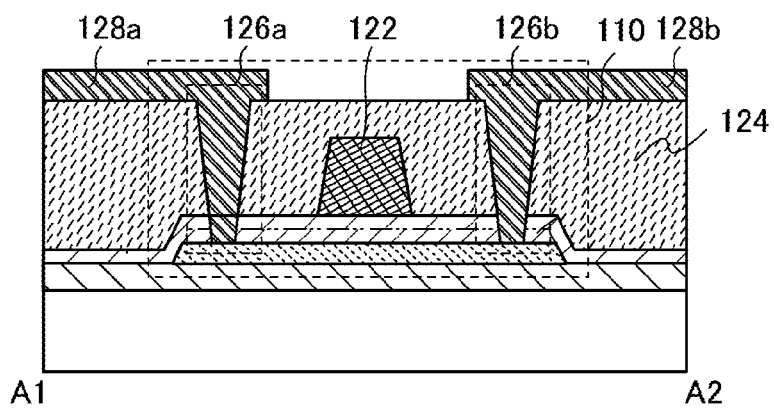

Through the above process, the transistor 110 illustrated in FIG. 1B can be formed (see FIG. 2E).

In forming the transistor 120 in FIG. 1C, the gate electrode 122 is formed and then the oxide semiconductor film 114 is doped with a dopant with the gate electrode 122 used as a mask. The use of the gate electrode 122 as a mask in the doping the oxide semiconductor film 114 with the dopant allows the pair of second regions 134a and 134b containing the dopant and the first region 135 not doped with any dopant to be formed in a self-aligned manner. The first region 135 overlapping with the gate electrode 122 serves as a channel region. The pair of second regions 134a and 134b containing a dopant serves as a source region and a drain region.

The oxide semiconductor film 114 can be doped with the dopant by an ion doping method or an ion implantation method. Alternatively, the oxide semiconductor film 114 can be doped with the dopant in the following manner: plasma is generated in an atmosphere of a gas containing an element to be added and plasma treatment is performed on the object to which the dopant is added. A dry etching apparatus, a plasma CVD apparatus, a high-density plasma CVD apparatus, or the like can be used to generate the plasma.

After the oxide semiconductor film 114 is doped with the dopant, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 134a and 134b containing the dopant can be reduced. In the heat treatment, the pair of second regions 134a and 134b containing the dopant may be in either a crystalline state or an amorphous state. Further, oxygen is diffused from the gate insulating film 118 and the insulating film 102 into the oxide semiconductor film, so that oxygen vacancies in the oxide semiconductor film can be reduced.

The above method allows interfacial bonding between the oxide semiconductor film 114 and the gate insulating film 116, so that the structure of the oxide semiconductor film and the structure of the gate insulating film can be made continuous at the interface therebetween. Accordingly, the number of interface states at the interface between the oxide semiconductor film 114 and the gate insulating film 116 can be reduced, leading to a reduction in generation of space charge. Consequently, scattering of carriers (electrons) at the interface between the oxide semiconductor film 114 and the gate insulating film 116 can be reduced, leading to an increase in field-effect mobility of the transistor. Further, a change in operating point or threshold voltage of the transistor can be reduced.

Next, a method for forming a transistor which is partly different from the formation method illustrated in the FIG. 2A to 2E will be described with reference to FIGS. 3A to 3E.

Figure 3A:
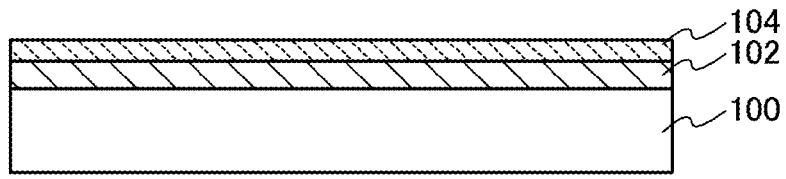
FIGS. 3A to 3E illustrate a semiconductor device and a method for manufacturing the semiconductor device of one embodiment.

First, the insulating film 102 and the oxide semiconductor film 104 are formed over the substrate 100 (see FIG. 3A). The insulating film 102 is preferably formed using an oxide insulating film from which part of oxygen is released by heating.

Then, a mask is formed over the oxide semiconductor film 104 and etching is performed, whereby an island-shaped oxide semiconductor film 132 is formed.

Figure 3B:
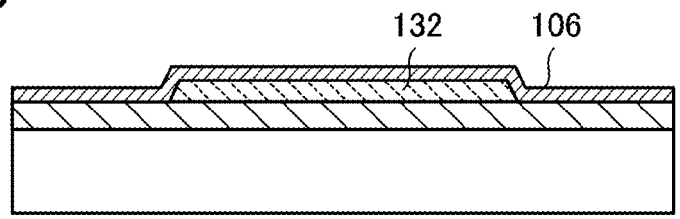

Then, the film 106 of a semiconductor other than an oxide semiconductor is formed so as to cover the insulating film 102 and the island-shaped oxide semiconductor film 132 (see FIG. 3B). It is needless to say that instead of the film 106 of a semiconductor other than an oxide semiconductor, a metal film may be formed using, for example, any one of aluminum (Al), zirconium (Zr), hafnium (Hf), and tantalum (Ta).

Figure 3C:
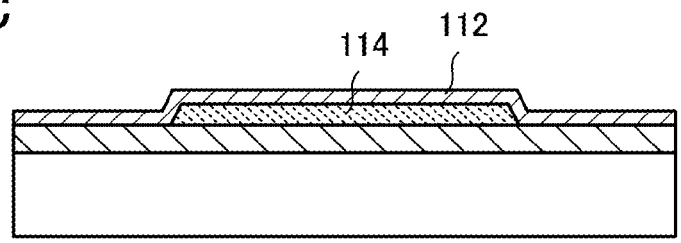

After that, the oxide semiconductor film 132 and the film 106 of a semiconductor other than an oxide semiconductor are subjected to heat treatment, so that the oxide semiconductor film 114 and the insulating film 112 are formed (see FIG. 3C).

The heat treatment is performed with the oxide semiconductor film 132 and the insulating film 102 in contact with the film 106 of a semiconductor other than an oxide semiconductor, whereby an oxygen atom in the oxide semiconductor film 132 is bonded to an atom in the film 106 of a semiconductor other than an oxide semiconductor at the interface between the oxide semiconductor film 132 and the film 106 of a semiconductor other than an oxide semiconductor. Accordingly, the structure of the oxide semiconductor film and the structure of the film of a semiconductor other than an oxide semiconductor can be made continuous at the interface therebetween. Further, when oxygen released from the oxide semiconductor film 132 and the insulating film 102 is diffused into the film 106 of a semiconductor other than an oxide semiconductor, the film 106 of a semiconductor other than an oxide semiconductor can be oxidized to form the insulating film 112. The insulating film 112 can be used as a gate insulating film.

In the case of using the metal film instead of the film 106 of a semiconductor other than an oxide semiconductor, the insulating film 112 is an aluminum oxide film, a zirconium oxide film, a hafnium oxide film, or a tantalum oxide film.

Figure 3D:
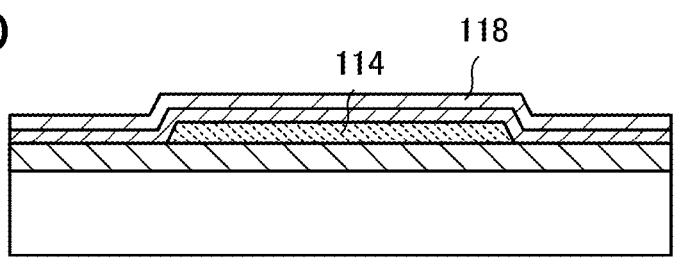

Then, the gate insulating film 118 is formed over the insulating film 112 (see FIG. 3D). FIGS. 3A to 3E illustrate the case where the insulating film 112 and the gate insulating film 118 are formed using different materials. Thus, the interface between the insulating film 112 and the gate insulating film 118 is indicated by a solid line. For example, a film of a high-k material can be formed as the gate insulating film 118 over the insulating (silicon oxide) film 112. Consequently, the S value and on-state current can be improved.

Figure 3E:
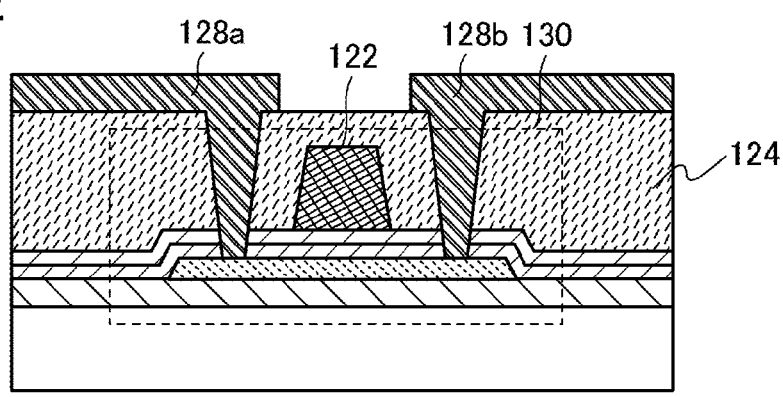

After that, the gate electrode 122, the insulating film 124, the source electrode 128a, and the drain electrode 128b are formed as illustrated in FIG. 2E, whereby a transistor 130 can be formed (see FIG. 3E).

The method illustrated in FIGS. 3A to 3E allows interfacial bonding between the oxide semiconductor film 114 and the insulating film 112, so that the structure of the oxide semiconductor film and the structure of the insulating film can be made continuous at the interface therebetween. Accordingly, the number of interface states at the interface between the oxide semiconductor film 114 and the insulating film 112 (gate insulating film) can be reduced, leading to a reduction in generation of space charge. Consequently, scattering of carriers (electrons) at the interface between the oxide semiconductor film 114 and the gate insulating film can be reduced, leading to an increase in field-effect mobility of the transistor. Further, a change in operating point or threshold voltage of the transistor can be reduced.

The structures, methods, and the like which are described in this embodiment can be combined as appropriate with any of the structures, methods, and the like which are described in the other embodiments.

Embodiment 2

In this embodiment, a transistor having a structure different from that of Embodiment 1 and a method for forming the transistor will be described with reference to FIGS. 4A and 4B and FIGS. 5A to 5E.

Figure 4A:
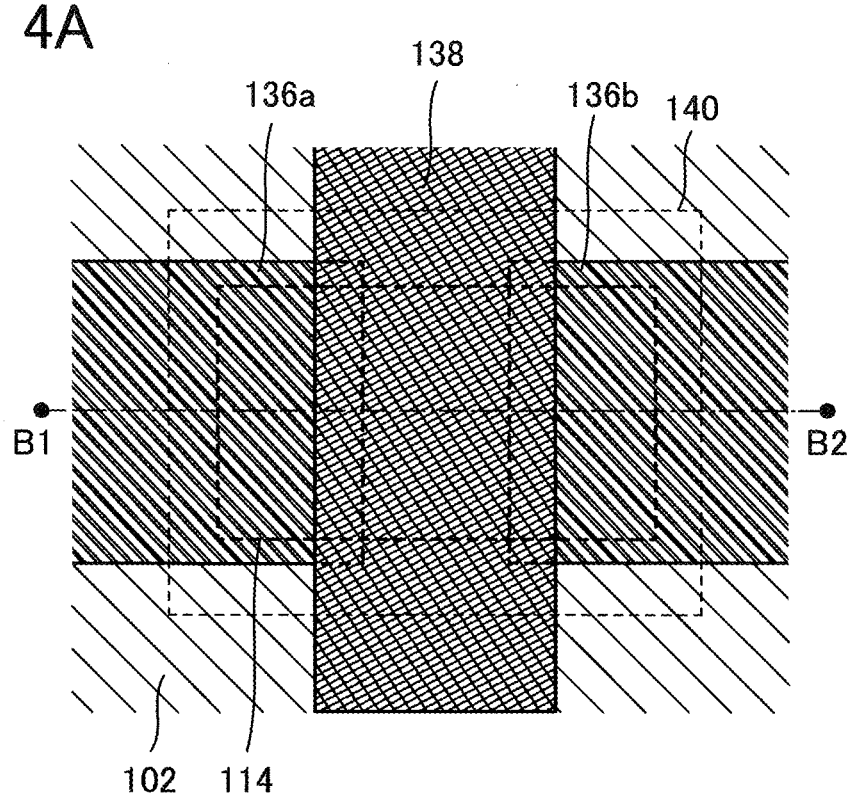
FIGS. 4A and 4B illustrate a semiconductor device of one embodiment.
Figure 4B:
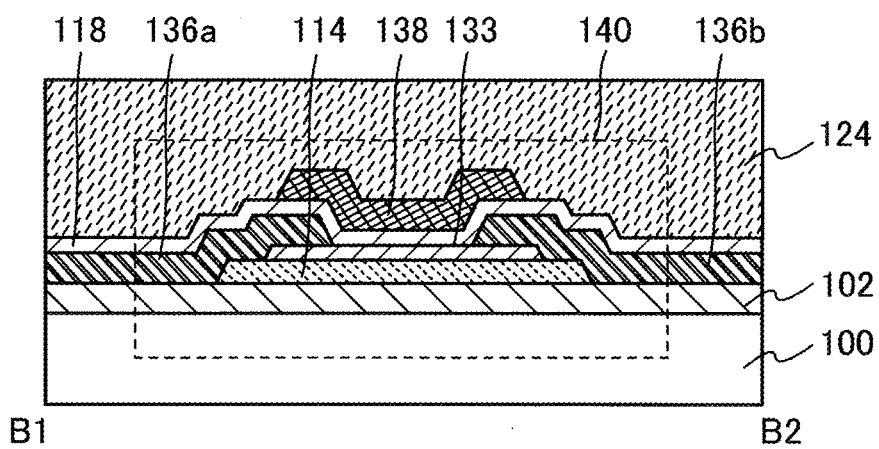

FIGS. 4A and 4B are a plan view and a cross-sectional view of a transistor 140 as an example of a semiconductor device of one embodiment of the present invention. FIG. 4A is a plan view, and FIG. 4B is a cross-sectional view along B1-B2 in FIG. 4A. Note that in FIG. 4A, some components of the transistor 140 (e.g., the gate insulating film 116, the gate insulating film 118, and the insulating film 124) are omitted for simplicity.

The transistor 140 in FIGS. 4A and 4B includes the oxide semiconductor film 114 provided over the substrate 100; a gate insulating film 133 provided in contact with the oxide semiconductor film 114; source and drain electrodes 136a and 136b provided in contact with the top surface of the oxide semiconductor film 114; the gate insulating film 118 provided so as to cover the gate insulating film 133 and the source and drain electrodes 136a and 136b; and a gate electrode 138 provided over the gate insulating film 118. Note that the insulating film 102 may be provided between the substrate 100 and the oxide semiconductor film 114. Further, the insulating film 124 may be provided so as to cover the gate insulating film 118 and the gate electrode 138.

End portions of the source electrode 136a and the drain electrode 136b preferably have tapered shapes. When the end portions of the source electrode 136a and the drain electrode 136b are tapered, the coverage with the gate insulating film 118 can be improved and disconnection of the gate insulating film 118 in the above end portions can be prevented. Here, the taper angle is greater than or equal to 20° and less than or equal to 45°, for example. Note that the taper angle is a tilt angle formed by a side surface and the bottom surface of a film having a tapered shape (e.g., the source electrode 136a and the drain electrode 136b) in the case where the film is observed from the direction perpendicular to a cross section (a plane perpendicular to a surface of a substrate).

In the transistor having the structure in FIGS. 4A and 4B, the source electrode 136a and the drain electrode 136b are in contact with the top surface and side surfaces of the oxide semiconductor film 114, so that favorable contact can be obtained and contact resistance can be reduced. Further, unlike the transistor 110 and the transistor 120, it is not necessary to form a contact hole; thus, the decrease in number of contact holes leads to a reduction in occupation area.

Next, a method for forming the transistor in FIGS. 4A and 4B will be described with reference to FIGS. 5A to 5E.

Figure 5A:
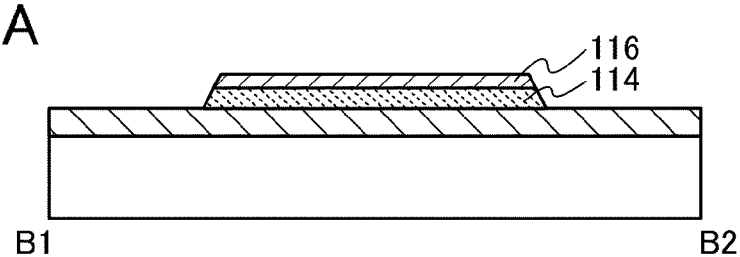
FIGS. 5A to 5E illustrate a semiconductor device and a method for manufacturing the semiconductor device of one embodiment.

First, through steps described with reference to FIGS. 2A to 2C, the insulating film 102, the island-shaped oxide semiconductor film 114, and the island-shaped gate insulating film 116 are formed over the substrate 100 (see FIG. 5A).

Figure 5B:
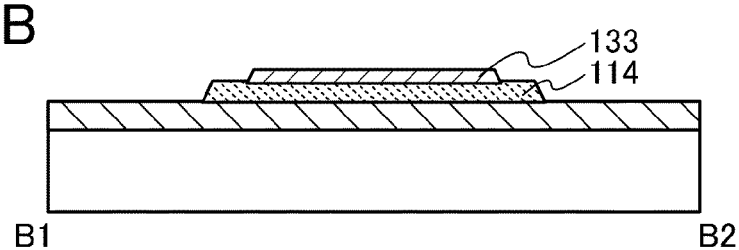
Figure 5C:
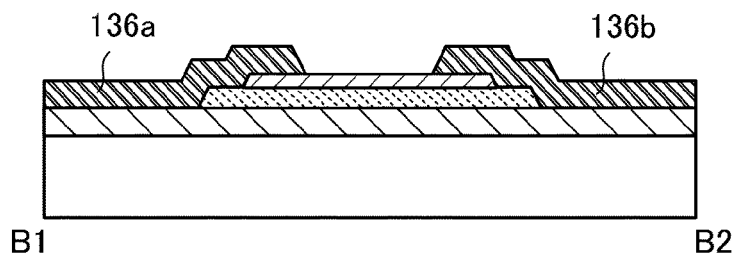

Then, a mask is formed over the gate insulating film 116 and etching is performed, whereby a silicon oxide film whose area is smaller than that of the oxide semiconductor film 114 is formed (see FIG. 5B). The silicon oxide film whose area is smaller than that of the oxide semiconductor film 114 is used as the gate insulating film 133. Through the above steps, part of the top surface of the oxide semiconductor film 114 is exposed.

Then, a conductive film for forming the source electrode and the drain electrode (as well as a wiring formed in the same layer as the source electrode and the drain electrode) is formed over the insulating film 102, the oxide semiconductor film 114, and the gate insulating film 133. After that, a mask is formed over the conductive film and etching is performed, whereby the source electrode 136a and the drain electrode 136b are formed (see FIG. 5C). For a material and a formation method of the conductive film used for the source electrode 136a and the drain electrode 136b, refer to the description of the source electrode 128a and the drain electrode 128b in Embodiment 1.

Figure 5D:
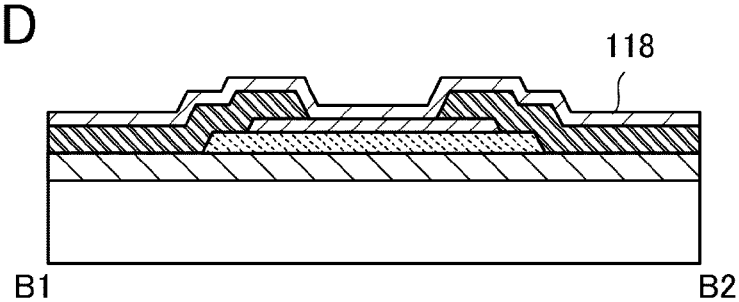

Then, the gate insulating film 118 is formed so as to cover the gate insulating film 133, the source electrode 136a, and the drain electrode 136b (see FIG. 5D).

Then, a conductive film used for forming a gate electrode (as well as a wiring formed in the same layer as the gate electrode) is formed over the gate insulating film 118. After that, a mask is formed over the conductive film and etching is performed, whereby the gate electrode 138 is formed (see FIG. 5E). For a material and a formation method of the conductive film used for the gate electrode 138, refer to the description of the gate electrode 122 in Embodiment 1.

Figure 5E:
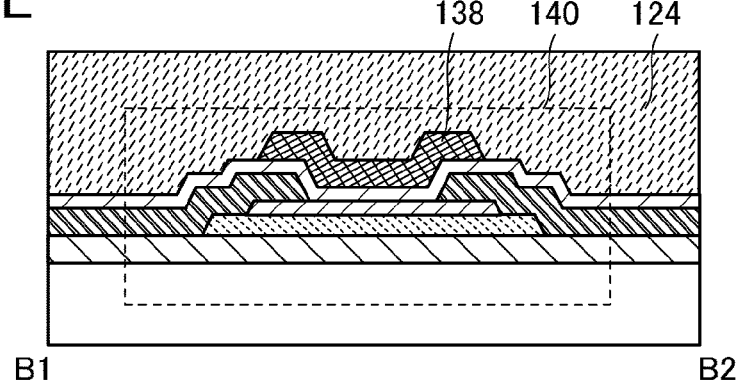

Then, the insulating film 124 is formed so as to cover the gate insulating film 118 and the gate electrode 122 (see FIG. 5E).

Through the above process, the transistor 140 illustrated in FIGS. 4A and 4B can be formed (see FIG. 5E).

The method described in this embodiment allows interfacial bonding between the oxide semiconductor film 114 and the gate insulating film 133, so that the structure of the oxide semiconductor film and the structure of the gate insulating film can be made continuous at the interface therebetween. Accordingly, the number of interface states at the interface between the oxide semiconductor film 114 and the gate insulating film 133 can be reduced, leading to a reduction in generation of space charge. Consequently, scattering of carriers (electrons) at the interface between the oxide semiconductor film 114 and the gate insulating film 133 can be reduced, leading to an increase in field-effect mobility of the transistor. Further, a change in operating point or threshold voltage of the transistor can be reduced.

The structures, methods, and the like which are described in this embodiment can be combined as appropriate with any of the structures, methods, and the like which are described in the other embodiments.

Embodiment 3

In this embodiment, a transistor having a structure different from those of Embodiments 1 and 2 and a method for forming the transistor will be described with reference to FIGS. 6A to 6C and FIGS. 7A to 7E.

Figure 6A:
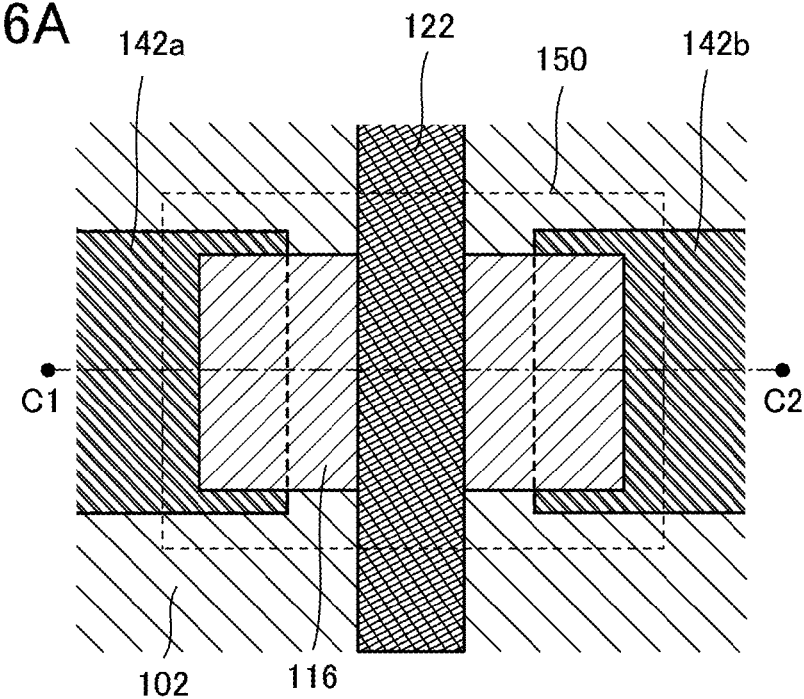
FIGS. 6A to 6C illustrate a semiconductor device of one embodiment.
Figure 6B:
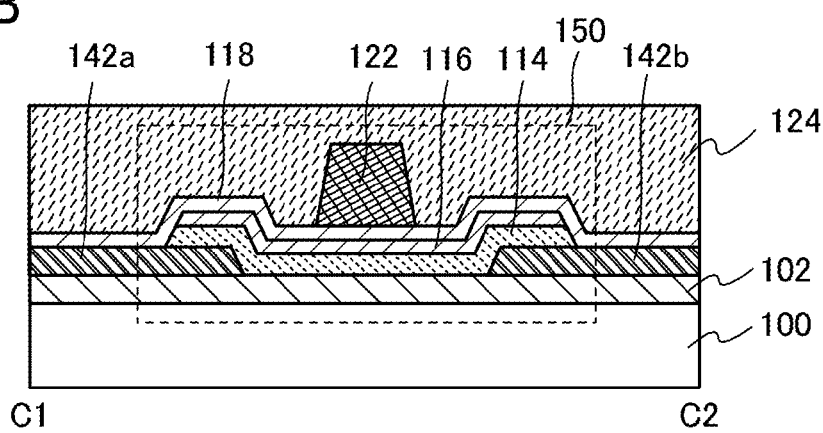

FIGS. 6A and 6B are a plan view and a cross-sectional view of a transistor 150 as an example of a semiconductor device of one embodiment of the present invention. FIG. 6A is a plan view, and FIG. 6B is a cross-sectional view along C1-C2 in FIG. 6A. Note that in FIG. 6A, some components of the transistor 150 (e.g., the gate insulating film 118 and the insulating film 124) are omitted for simplicity.

The transistor 150 in FIGS. 6A and 6B includes source and drain electrodes 142a and 142b provided over the substrate 100; the oxide semiconductor film 114 provided over the source and drain electrodes 142a and 142b; the gate insulating film 116 provided in contact with the oxide semiconductor film 114; the gate insulating film 118 provided so as to cover the source and drain electrodes 142a and 142b, the oxide semiconductor film 114, and the gate insulating film 116; and the gate electrode 122 provided over the gate insulating film 118. Note that the insulating film 102 may be provided between the substrate 100 and the oxide semiconductor film 114. Further, the insulating film 124 may be provided so as to cover the gate insulating film 118 and the gate electrode 152.

Figure 6C:
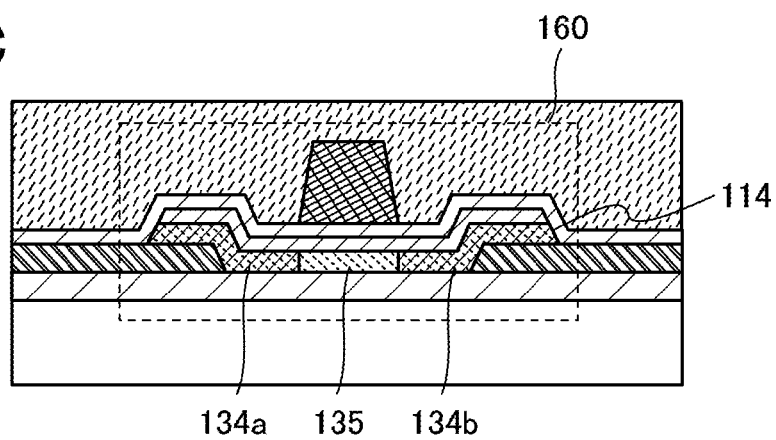

In the structure of the transistor 160 in FIG. 6C, for example, the gate insulating film 116 is formed using silicon oxide, and the gate insulating film 118 is formed using a high-k material, so that the S value and on-state current can be improved.

Further, as in the case of the transistor 160 in FIG. 6C, the oxide semiconductor film 114 may be doped with a dopant to form the first region 135 and the pair of second regions 134a and 134b. When the oxide semiconductor film 114 is doped with a dopant with the use of the gate electrode 122 as a mask, in the oxide semiconductor film 114, the first region 135 is formed in a region overlapping with the gate electrode 122 and the pair of second regions 134a and 134b are formed so that the first region 135 is sandwiched therebetween. For the kind and the concentration of the dopant added to the second regions 134a and 134b, refer to the description in Embodiment 1.

The transistor 160 is the same as the transistor 150 except that the first region 135 and the second regions 134a and 134b are formed in the oxide semiconductor film 114. As for the top view of the transistor 160, refer to FIG. 6A.

Next, a method for forming the transistor in FIGS. 6A and 6B will be described with reference to FIGS. 7A to 7E.

The insulating film 102 is formed over the substrate 100, and then a conductive film used for forming a source electrode and a drain electrode (as well as a wiring formed in the same layer as the source electrode and the drain electrode) is formed over the insulating film 102. After that, a mask is formed over the conductive film and etching is performed, whereby the source electrode 142a and the drain electrode 142b are formed (see FIG. 7A). For a material and a formation method of the conductive film used for the source electrode 142a and the drain electrode 142b, refer to the description of the source electrode 128a and the drain electrode 128b in Embodiment 1.

Figure 7A:
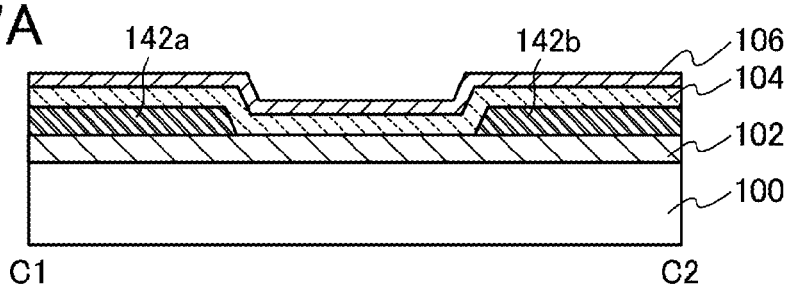
FIGS. 7A to 7E illustrate a semiconductor device and a method for manufacturing the semiconductor device of one embodiment.

Then, the oxide semiconductor film 104 and the film 106 of a semiconductor other than an oxide semiconductor are formed over the insulating film 102, the source electrode 142a, and the drain electrode 142b (see FIG. 7A). Heat treatment for the dehydration or dehydrogenation may be performed after the formation of the oxide semiconductor film 104 and before the formation of the film 106 of a semiconductor other than an oxide semiconductor.

Figure 7B:
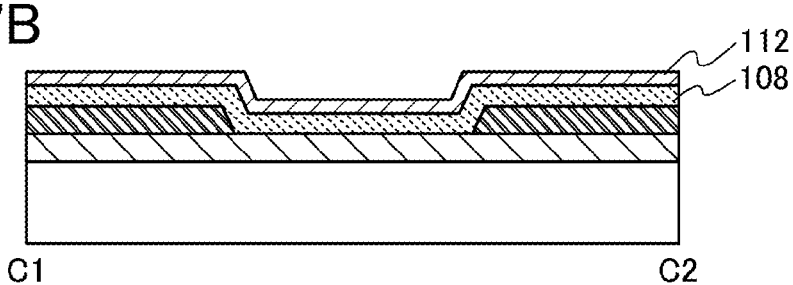

Then, the oxide semiconductor film 104 and the film 106 of a semiconductor other than an oxide semiconductor are subjected to heat treatment to form the oxide semiconductor film 108 and the insulating film 112 (see FIG. 7B).

Figure 7C:
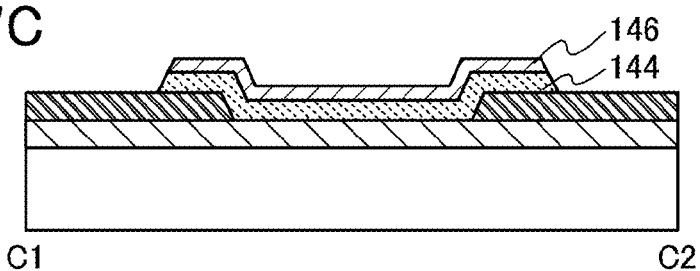

Then, a mask is formed over the insulating film 112 and etching is performed, whereby an island-shaped insulating film 146 and an island-shaped oxide semiconductor film 144 are formed (see FIG. 7C).

Figure 7D:
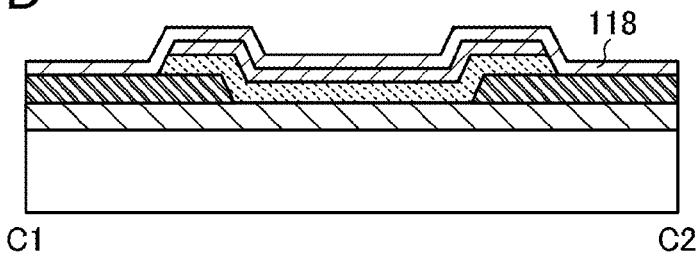

Then, the gate insulating film 118 is formed so as to cover the insulating film 146, the source electrode 142a, and the drain electrode 142b (see FIG. 7D).

Then, a conductive film used for forming a gate electrode (as well as a wiring formed in the same layer as the gate electrode) is formed over the gate insulating film 118. After that, a mask is formed over the conductive film and etching is performed, whereby the gate electrode 122 is formed (see FIG. 7E).

Figure 7E:
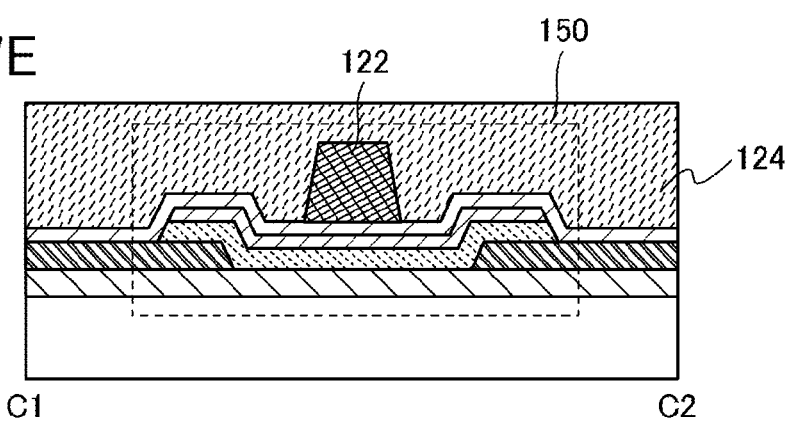

Then, the insulating film 124 is formed so as to cover the gate insulating film 118 and the gate electrode 122 (see FIG. 7E).

Through the above process, the transistor 150 illustrated in FIG. 6B can be formed (see FIG. 7E).

In forming the transistor 160 in FIG. 6C, the gate electrode 122 is formed and then the oxide semiconductor film 144 is doped with a dopant with the gate electrode 122 used as a mask. The use of the gate electrode 122 as a mask in the doping allows the pair of second regions 134a and 134b containing the dopant and the first region 135 not doped with any dopant to be formed in a self-aligned manner. The first region 135 overlapping with the gate electrode 122 serves as a channel region. The pair of second regions 134a and 134b containing a dopant serves as a source region and a drain region. For a method of doping the oxide semiconductor film 114 with a dopant, refer to the description in Embodiment 1.

After the oxide semiconductor film 114 is doped with the dopant, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 134a and 134b containing the dopant can be reduced.

The method described in this embodiment allows interfacial bonding between the oxide semiconductor film 114 and the insulating film 146, so that the structure of the oxide semiconductor film and the structure of the insulating film can be made continuous at the interface therebetween. Accordingly, the number of interface states at the interface between the oxide semiconductor film 114 and the insulating film 146 (gate insulating film) can be reduced, leading to a reduction in generation of space charge. Consequently, scattering of carriers (electrons) at the interface between the oxide semiconductor film 114 and the gate insulating film can be reduced, leading to an increase in field-effect mobility of the transistor. Further, a change in operating point or threshold voltage of the transistor can be reduced.

The structures, methods, and the like which are described in this embodiment can be combined as appropriate with any of the structures, methods, and the like which are described in the other embodiments.

Embodiment 4

In this embodiment, a transistor having a structure different from those of Embodiments 1 to 3 and a method for forming the transistor will be described with reference to FIGS. 8A and 8B and FIGS. 9A to 9E.

Figure 8A:
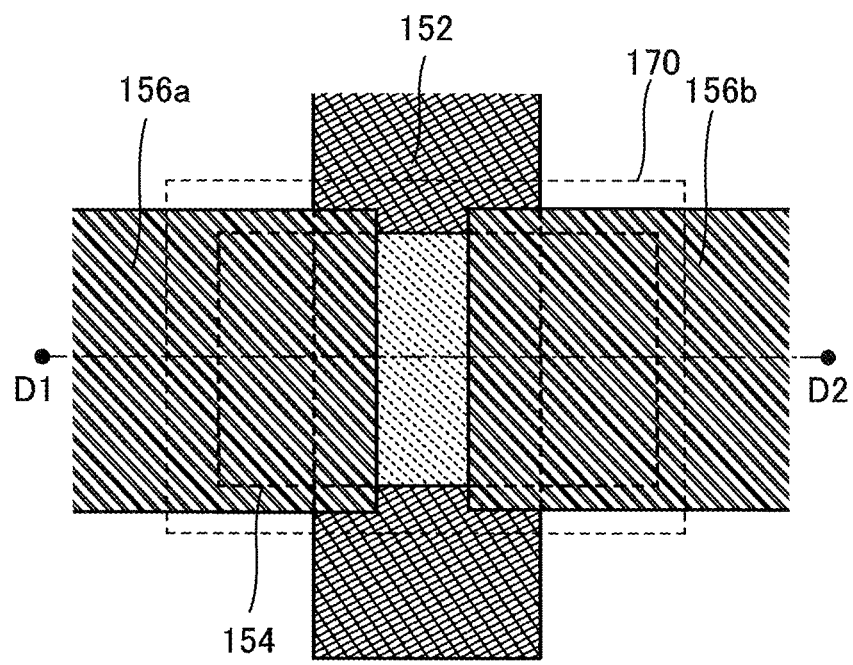
FIGS. 8A and 8B illustrate a semiconductor device of one embodiment.
Figure 8B:
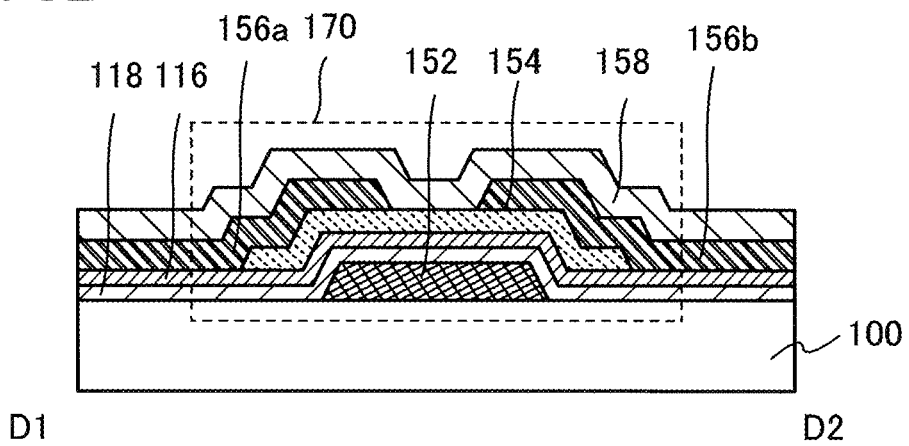

FIGS. 8A and 8B are a plan view and a cross-sectional view of a transistor 170 as an example of a semiconductor device of one embodiment of the present invention. FIG. 8A is a plan view, and FIG. 8B is a cross-sectional view along D1-D2 in FIG. 8A. Note that in FIG. 8A, some components of the transistor 170 (e.g., the gate insulating film 116, the gate insulating film 118, and the insulating film 158) are omitted for simplicity.

The transistor 170 in FIGS. 8A and 8B includes the gate electrode 152 provided over the substrate 100; the gate insulating film 118 provided over the gate electrode 152; the gate insulating film 116 provided over the gate insulating film 118; the oxide semiconductor film 154 provided over the gate insulating film 116; and source and drain electrodes 156a and 156b provided in contact with the top surface of the oxide semiconductor film 154. Note that the insulating film 158 may be provided so as to cover the oxide semiconductor film 154, the source electrode 156a, and the drain electrode 156b.

In the transistor having the structure in FIGS. 8A and 8B, the source electrode 156a and the drain electrode 156b are in contact with the top surface and side surfaces of the oxide semiconductor film 154, so that favorable contact can be obtained and contact resistance can be reduced. Further, unlike the transistor 110 and the transistor 120, it is not necessary to form a contact hole; thus, the decrease in number of contact holes leads to a reduction in occupation area.

Next, a method for forming the transistor 170 in FIGS. 8A and 8B will be described with reference to FIGS. 9A to 9E.

First, a conductive film used for forming a gate electrode (as well as a wiring formed in the same layer as the gate electrode) is formed over the substrate 100. After that, a mask is formed over the conductive film and etching is performed, whereby the gate electrode 152 is formed (see FIG. 9A). For a material and a formation method of the conductive film used for the gate electrode 152, refer to the description of the gate electrode 122 in Embodiment 1.

Figure 9A:
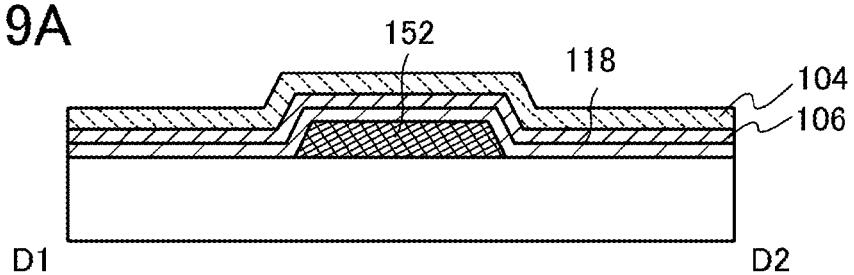
FIGS. 9A to 9E illustrate a semiconductor device and a method for manufacturing the semiconductor device of one embodiment.

Then, the gate insulating film 118, the film 106 of a semiconductor other than an oxide semiconductor, and the oxide semiconductor film 104 are sequentially formed over the substrate 100 and the gate electrode 152 (see FIG. 9A).

Figure 9B:
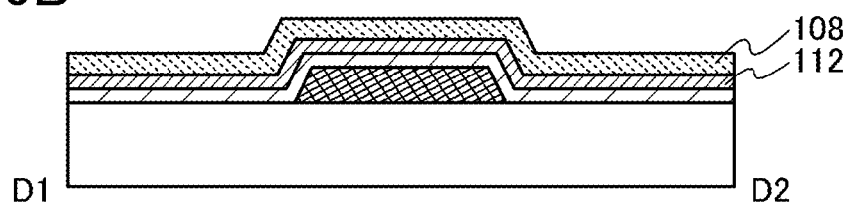

Then, the oxide semiconductor film 104 and the film 106 of a semiconductor other than an oxide semiconductor are subjected to heat treatment to form the oxide semiconductor film 108 and the insulating film 112 (see FIG. 9B).

Figure 9C:
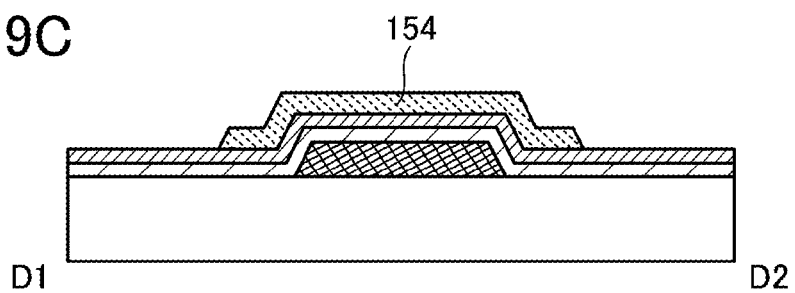
Figure 9D:
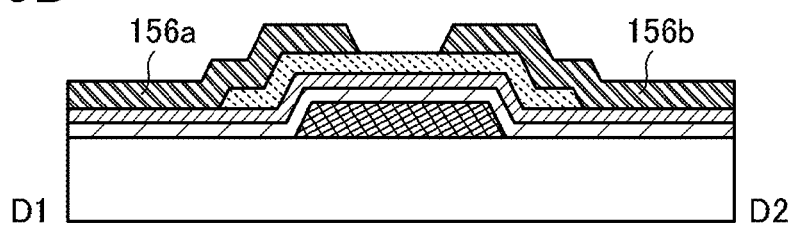

Then, a mask is formed over the oxide semiconductor film 108 and etching is performed, whereby the island-shaped oxide semiconductor film 154 is formed (see FIG. 9C).

Then, a conductive film used for forming a source electrode and a drain electrode (as well as a wiring formed in the same layer as the source electrode and the drain electrode) is formed over the oxide semiconductor film 154. After that, a mask is formed over the conductive film and etching is performed, whereby the source electrode 156a and the drain electrode 156b are formed (see FIG. 9D). For a material and a formation method of the conductive film used for the source electrode 156a and the drain electrode 156b, refer to the description of the source electrode 128a and the drain electrode 128b in Embodiment 1.

Figure 9E:
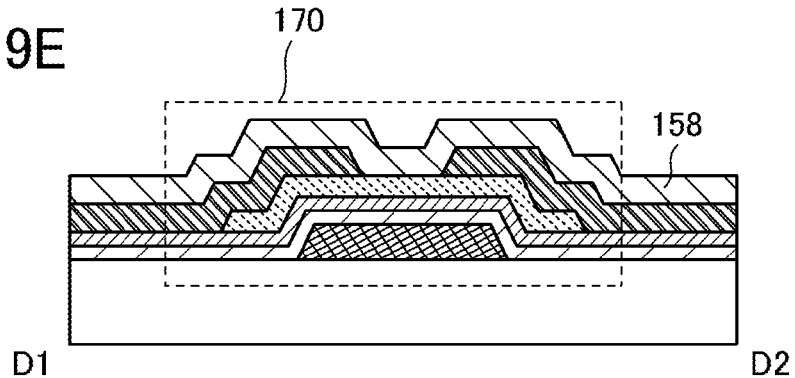

Then, the insulating film 158 is formed over the source electrode 156a, the drain electrode 156b, and the oxide semiconductor film 154 (see FIG. 9E). For a material and a formation method of the insulating film 158, refer to the description of the insulating film 124 in Embodiment 1.

Through the above process, the transistor 170 illustrated in FIGS. 8A and 8B can be formed (see FIG. 9E).

The method described in this embodiment allows interfacial bonding between the oxide semiconductor film 154 and the insulating film 112, so that the structure of the oxide semiconductor film and the structure of the insulating film can be made continuous at the interface therebetween. Accordingly, the number of interface states at the interface between the oxide semiconductor film 154 and the insulating film 112 (gate insulating film) can be reduced, leading to a reduction in generation of space charge. Consequently, scattering of carriers (electrons) at the interface between the oxide semiconductor film 154 and the gate insulating film can be reduced, leading to an increase in field-effect mobility of the transistor. Further, a change in operating point or threshold voltage of the transistor can be reduced.

The structures, methods, and the like which are described in this embodiment can be combined as appropriate with any of the structures, methods, and the like which are described in the other embodiments.

Embodiment 5

A semiconductor device having a display function (also referred to as a display device) can be manufactured using any of the transistors exemplified in Embodiments 1 to 4. Moreover, some of or all driver circuits which include the transistors can be formed over a substrate where a pixel portion is formed, whereby a system-on-panel can be obtained.

Figure 10A:
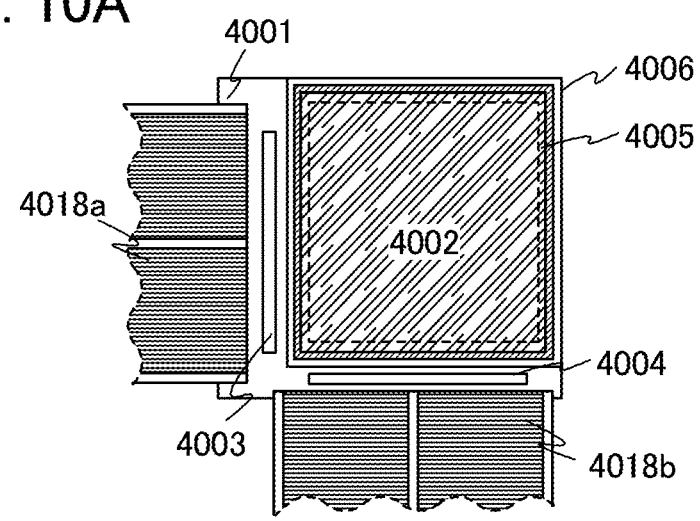
FIGS. 10A to 10C each illustrate a semiconductor device of one embodiment.

In FIG. 10A, a sealant 4005 is provided so as to surround a pixel portion 4002 provided over a first substrate 4001, and the pixel portion 4002 is sealed with a second substrate 4006. In FIG. 10A, a signal line driver circuit 4003 and a scan line driver circuit 4004 which are formed using a single crystal semiconductor film or a polycrystalline semiconductor film over another substrate are mounted in a region that is different from the region surrounded by the sealant 4005 over the first substrate 4001. Various signals and potential are supplied to the signal line driver circuit 4003 and the scan line driver circuit 4004, each of which is separately formed, and the pixel portion 4002 from flexible printed circuits (FPCs) 4018a and 4018b.

Figure 10B:
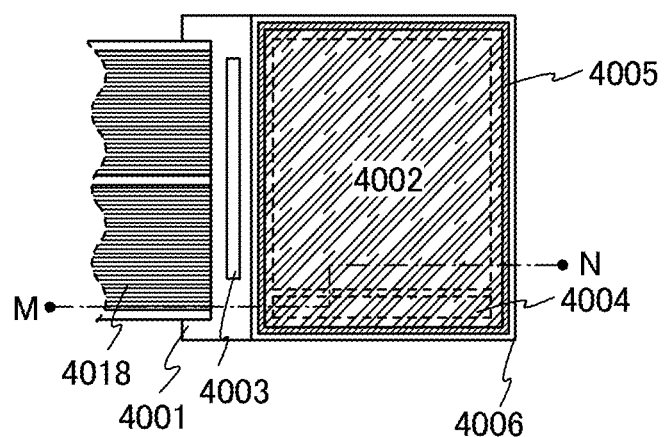
Figure 10C:
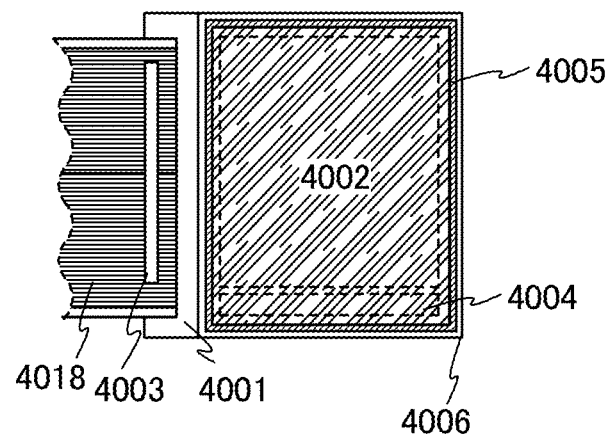

In FIGS. 10B and 10C, the sealant 4005 is provided so as to surround the pixel portion 4002 and the scan line driver circuit 4004 which are provided over the first substrate 4001. Further, the second substrate 4006 is provided over the pixel portion 4002 and the scan line driver circuit 4004. Thus, the pixel portion 4002 and the scan line driver circuit 4004 are sealed together with a display element, by the first substrate 4001, the sealant 4005, and the second substrate 4006. In FIGS. 10B and 10C, the signal line driver circuit 4003 formed using a single crystal semiconductor film or a polycrystalline semiconductor film over another substrate is mounted in a region that is different from the region surrounded by the sealant 4005 over the first substrate 4001. In FIGS. 10B and 10C, various signals and potential are supplied to the signal line driver circuit 4003, the scan line driver circuit 4004, and the pixel portion 4002 from an FPC 4018.

Although FIGS. 10B and 10C each illustrate an example in which the signal line driver circuit 4003 is separately formed and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 10A illustrates an example in which the signal line driver circuit 4003 and the scan line driver circuit 4004 are mounted by a COG method. FIG. 10B illustrates an example in which the signal line driver circuit 4003 is mounted by a COG method. FIG. 10C illustrates an example in which the signal line driver circuit 4003 is mounted by a TAB method.

The display device includes in its category a panel in which a display element is sealed, and a module in which an IC and the like including a controller are mounted on the panel.

Note that the display device in this specification refers to an image display device, a display device, or a light source (including a lighting device). Furthermore, the display device also includes all the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors; any of the transistors exemplified in Embodiments 1 to 4 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element and an organic EL element. Furthermore, a display medium whose contrast is changed by an electric effect of electronic ink or the like can be used.

Figure 11A:
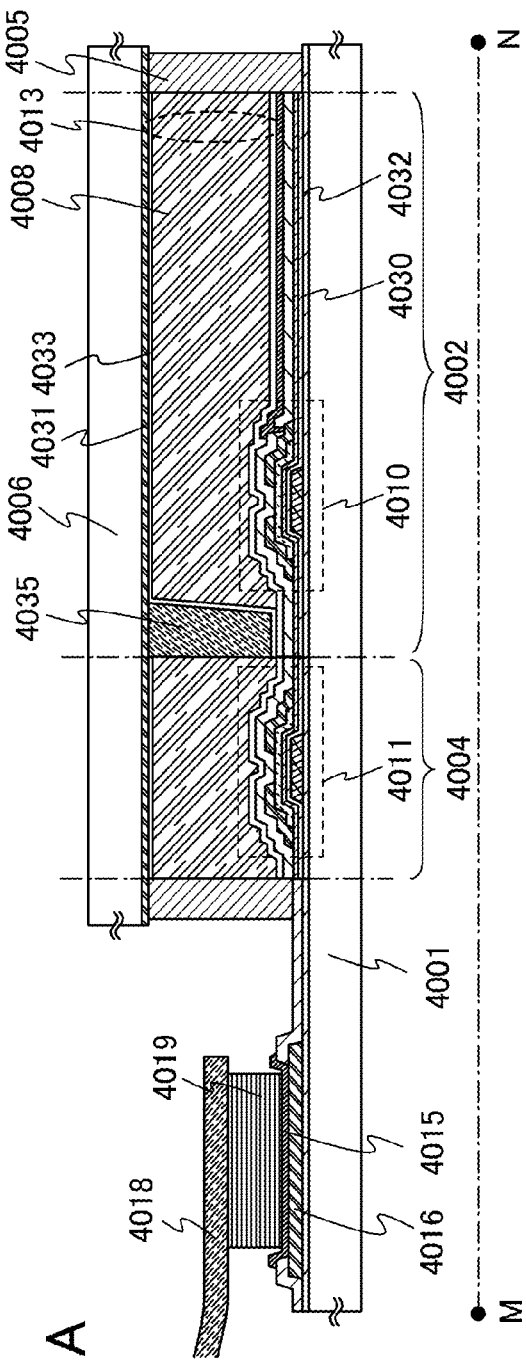
FIGS. 11A and 11B each illustrate a semiconductor device of one embodiment.
Figure 11B:
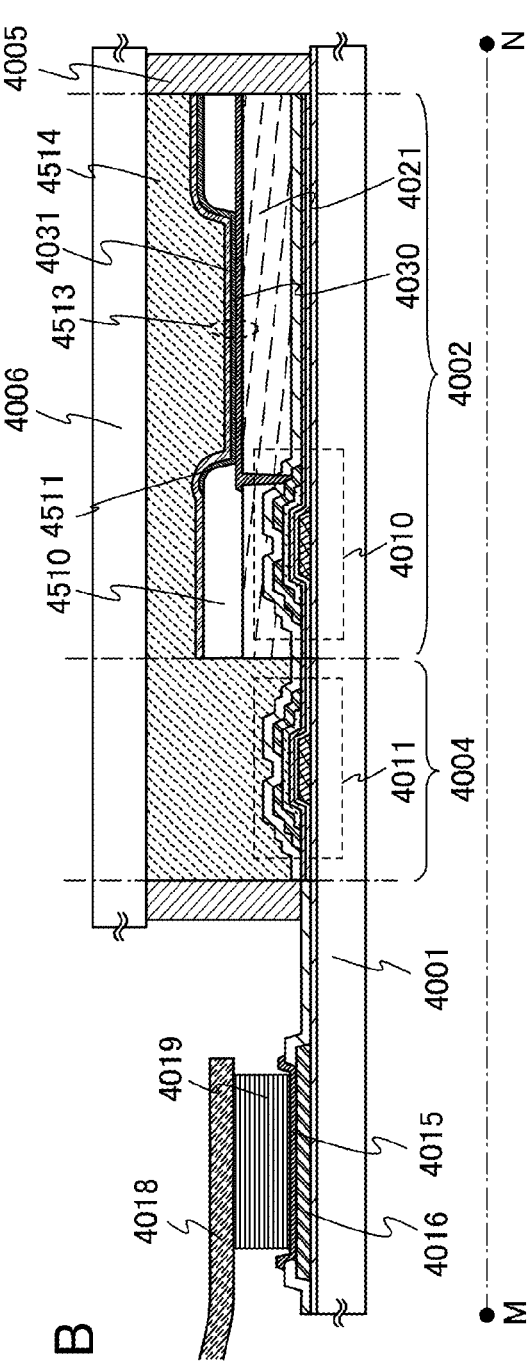

One embodiment of the semiconductor device will be described with reference to FIGS. 11A and 11B. FIGS. 11A and 11B are each a cross-sectional view along M-N in FIG. 10B.

As illustrated in FIGS. 11A and 11B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030. The terminal electrode 4016 is formed using the same conductive film as source and drain electrodes of transistors 4010 and 4011.

Further, the pixel portion 4002 and the scan line driver circuit 4004 which are provided over the first substrate 4001 each include a plurality of transistors. FIGS. 11A and 11B each illustrate the transistor 4010 included in the pixel portion 4002 and the transistor 4011 included in the scan line driver circuit 4004.

In this embodiment, an example is described in which the transistors described in Embodiment 4 are used as the transistors 4010 and 4011. Note that it is also possible to use any of the transistors described in the other embodiments may be used. In each of the transistors 4010 and 4011, interface scattering at the interface between the oxide semiconductor film and the gate insulating film is reduced, which increases the field-effect mobility. The use of such transistors for a semiconductor device enables fast response to input signals and high-speed driving; thus, the semiconductor device can have higher performance.

The transistor 4010 included in the pixel portion 4002 is electrically connected to a display element so that a display panel is formed. There is no particular limitation on the display element as long as display can be performed, and any of various kinds of display elements can be used.

FIG. 11A illustrates a liquid crystal display device using a liquid crystal element as a display element. In FIG. 11A, a liquid crystal element 4013 serving as a display element includes the first electrode layer 4030, a second electrode layer 4031, and a liquid crystal layer 4008. An insulating film 4032 and an insulating film 4033 each serving as an alignment film are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A spacer 4035 is a columnar spacer obtained by selectively etching an insulating film and is provided in order to control the thickness (cell gap) of the liquid crystal layer 4008. Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal which exhibits a blue phase and for which an alignment film is unnecessary may be used. A blue phase is one of liquid crystal phases, which is generated just before a cholesteric phase changes into an isotropic phase while temperature of cholesteric liquid crystal is increased. The blue phase appears only in a narrow temperature range; therefore, a liquid crystal composition into which several weight percent or more of a chiral material is mixed in order to widen the temperature range can be used. The liquid crystal composition containing liquid crystal exhibiting a blue phase and a chiral material has a short response time of 1 msec or less and has optical isotropy; the optical isotropy makes the alignment process unneeded and makes a viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification and the like is measured at 20° C.

The size of a storage capacitor provided in the liquid crystal display device is set considering the leakage current of the transistor provided in the pixel portion, or the like so that charge can be held for a predetermined period. When the transistor including the high-purity oxide semiconductor film is used, it is enough to provide a storage capacitor having a capacitance that is ⅓ or less, preferably ⅕ or less of a liquid crystal capacitance of each pixel.

In the transistor including the oxide semiconductor film of an embodiment of the present invention, the current in an off state (off-state current) can be small. Accordingly, an electrical signal such as an image signal can be held for a longer period, and an interval between writing operations can be set longer in an on state. Thus, the frequency of refresh operations can be reduced, which leads to a reduction in power consumption.

Further, the transistor including the oxide semiconductor film of one embodiment of the present invention can have high field-effect mobility and thus can be driven at high speed. Therefore, the use of the transistor in the pixel portion of the liquid crystal display device allows a high-quality image to be provided. In addition, since the transistor for a driver circuit portion and the transistor for the pixel portion can be formed over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be employed. The vertical alignment mode is a method of controlling the alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. When a field-sequential driving method is employed, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between dots of color elements. One embodiment of the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Here, the case will be described in which an organic EL element is used as a light-emitting element.

In order to extract light emitted from the light-emitting element, at least one of a pair of electrodes needs to be transparent. A transistor and the light-emitting element area formed over a substrate. The light-emitting element can have any of the following emission structures: a top emission structure in which light emission is extracted through the surface on the side opposite to the substrate side; a bottom emission structure in which light emission is extracted through the surface on the substrate side; and a dual emission structure in which light emission is extracted through the surface on the substrate side and the surface on the side opposite to the substrate side.

FIG. 11B illustrates a light-emitting device including a light-emitting element as a display element. A light-emitting element 4513 serving as a display element is electrically connected to the transistor 4010 provided in the pixel portion 4002. The light-emitting element 4513 has a layered structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening has a slope with a continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, and the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting element 4513 be sealed with a protective film (such as a bonding film or an ultraviolet curable resin film) or a cover material which allows high air-tightness and suppression of the entry of such gases (e.g., so that the light-emitting element 4513 is not exposed to the outside air, in this manner).

As the filler 4514, an ultraviolet curable resin or a thermosetting resin can be used other than an inert gas such as nitrogen or argon. Examples of such a resin include polyvinyl chloride (PVC), acrylic resin, polyimide resin, epoxy resin, silicone resin, polyvinyl butyral (PVB), and ethylene vinyl acetate (EVA). For example, nitrogen may be used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on a surface so as to reduce the glare can be performed.

As described above, the use of the transistor of one embodiment of the present invention allows formation of a semiconductor device capable of high-speed operation. Note that the transistors of one embodiment of the present invention can be used for semiconductor devices having a variety of functions, such as a power device mounted in a power circuit, a semiconductor integrated circuit such as LSI, and a semiconductor device having an image sensor function with which data of an object is read, in addition to the above semiconductor device having the display function.

The structures, methods, and the like which are described in this embodiment can be combined as appropriate with any of the structures, methods, and the like which are described in the other embodiments.

Embodiment 6

In this embodiment, a memory device will be described as an example of the semiconductor devices in the above embodiments with reference to FIGS. 12A and 12B.

Figure 12A:
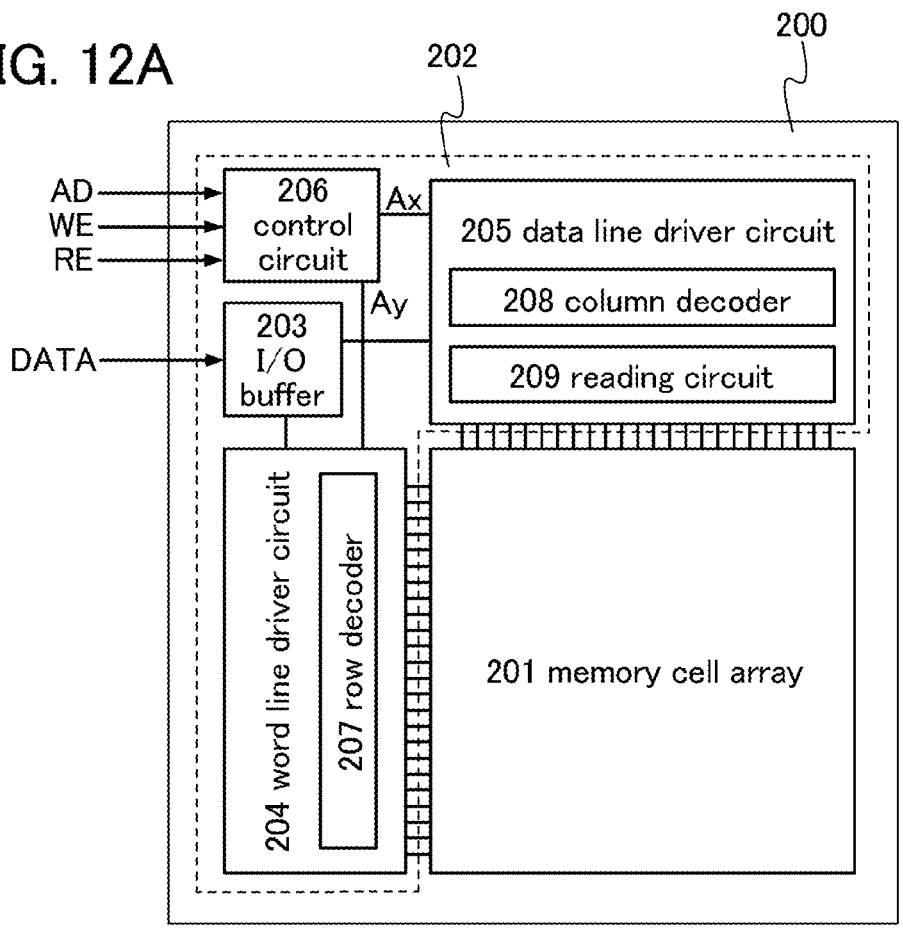
FIGS. 12A and 12B illustrate a semiconductor device of one embodiment.
Figure 12B:
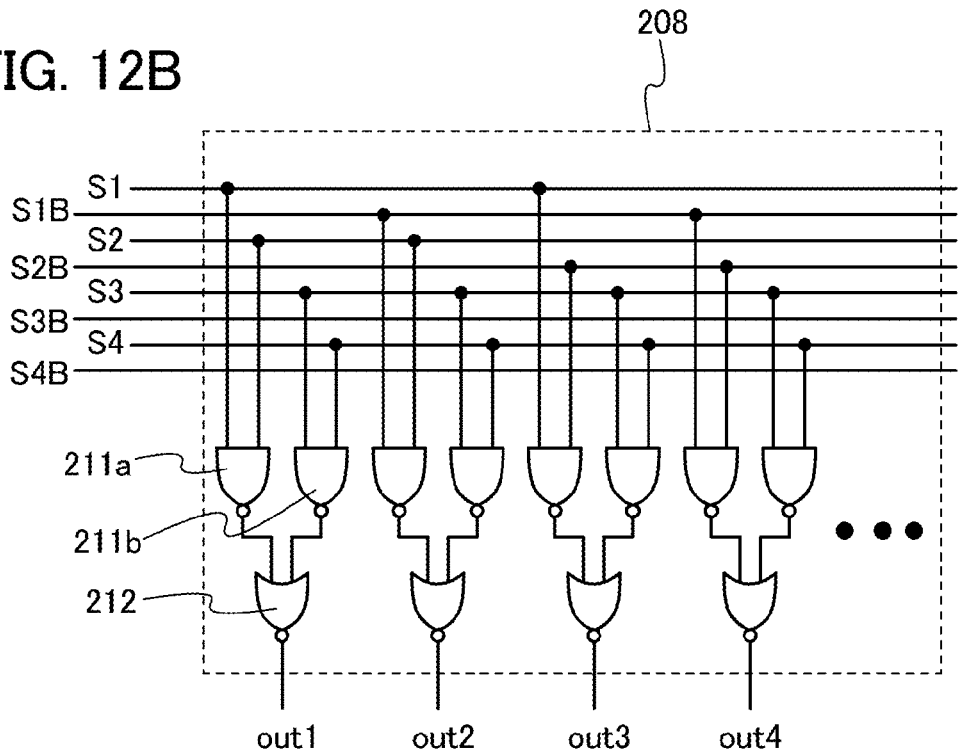

FIG. 12A is a block diagram illustrating a specific structure of a memory device. Note that in the block diagram in FIG. 12A, circuits in the memory device are classified in accordance with their functions and separated blocks are illustrated. However, it is difficult to classify actual circuits according to their functions completely and it is possible for one circuit to have a plurality of functions.

A memory device 200 in FIG. 12A includes a memory cell array 201 and a driver circuit 202. The driver circuit 202 includes an input/output buffer 203; a word line driver circuit 204 configured to control the potential of a word line; a data line driver circuit 205 configured to control writing and reading of data to/from a memory cell; and a control circuit 206 configured to control operations of the input/output buffer 203, the word line driver circuit 204, and the data line driver circuit 205.

The word line driver circuit 204 includes a row decoder 207. In addition to the row decoder 207, the word line driver circuit 204 includes a level shifter and a buffer. The data line driver circuit 205 includes a column decoder 208 and a reading circuit 209. The data line driver circuit 205 includes a selector and a level shifter in addition to the column decoder 208 and the reading circuit 209.

Note that the memory cell array 201, the input/output buffer 203, the word line driver circuit 204, the data line driver circuit 205, and the control circuit 206 can be formed using one substrate; any one of them may be formed using a substrate different from a substrate for the others; or all of them may be formed using different substrates.

In the case of using different substrates, electrical connection can be ensured with the use of an FPC (flexible printed circuit) or the like. In this case, part of the driver circuit 202 may be connected to an FPC by a COF (chip on film) method. Alternatively, electrical connection can be ensured by a COG (chip on glass) method.

When a signal AD containing an address Ax and an address Ay of the memory cell array 201 as data is input to the memory device 200, the control circuit 206 transmits the address Ax in the column direction and the address Ay in the row direction to the data line driver circuit 205 and the word line driver circuit 204, respectively. Further, the control circuit 206 transmits a signal DATA containing data input to the memory device 200 through the input/output buffer 203, to the data line driver circuit 205.

Selection of operation of writing data or operation of reading data in the memory cell array 201 is performed in accordance with a signal RE (read enable), a signal WE (write enable), or the like supplied to the control circuit 206. Further, in the case where the plurality of memory cell arrays 201 is provided, a signal CE (chip enable) for selecting the memory cell array 201 may be input to the control circuit 206. In this case, operation selected in accordance with the signal RE or the signal WE is performed in the memory cell array 201 selected in accordance with the signal CE.

In the memory cell array 201, when the writing operation is selected in accordance with the signal WE, a signal for selecting a memory cell corresponding to the address Ay is generated in the row decoder 207 included in the word line driver circuit 204 in response to an instruction from the control circuit 206. The amplitude of the signal is adjusted by the level shifter, and then the processed signal is input to the memory cell array 201 through the buffer. In the data line driver circuit 205, a signal for selecting a memory cell corresponding to the address Ax among the memory cells selected in the column decoder 208 is generated in response to an instruction from the control circuit 206. The amplitude of the signal is adjusted by the level shifter, and then the processed signal is input to the selector. In the selector, the signal DATA is sampled in accordance with the input signal, and the sampled signal is input to a memory cell corresponding to the address Ax or the address Ay.

In the memory cell array 201, when the reading operation is selected in accordance with the signal RE, a signal for selecting a memory cell corresponding to the address Ay is generated in the row decoder 207 included in the word line driver circuit 204 in response to an instruction from the control circuit 206. The amplitude of the signal is adjusted by the level shifter, and then the processed signal is input to the memory cell array 201 through the buffer. In the reading circuit 209, a memory cell corresponding to the address Ax is selected among the memory cells selected in the row decoder 207 in response to an instruction from the control circuit 206. Then, data stored in the memory cell corresponding to the address Ax or the address Ay is read, and a signal containing the data is generated.

Note that the data line driver circuit 205 may include a page buffer which can temporarily store the signal DATA, a precharge circuit which supplies a potential VR in advance to a data line in reading data, or the like.

Next, configurations of the row decoder and the column decoder will be described with reference to FIG. 12B. Here, a description will be given referring to the column decoder 208. As an example, the column decoder 208 of a 256-bit memory device including four bit lines and four word lines will be described. Note that the number of bit lines and the number of word lines can be determined as appropriate depending on the number of bits.

In the column decoder 208, address signals are input to NAND circuits 211a and 211b from address lines S1, S1B, S2, S2B, S3, S3B, S4, and S4B. Note that inversion signals of the signals input to S1, S2, S3, and S4 are input to S1B, S2B, S3B, and S4B, respectively. Signals are output from the NAND circuits 211a and 211b to output terminals out1 to out16 (not illustrated) through NOR circuits 212. With the configuration in FIG. 12B, a signal for selecting a memory cell corresponding to the address Ax among the selected memory cells in the column decoder 208 is generated. The amplitude of the signal is adjusted by the level shifter, and then the processed signal is input to the selector. In the selector, the signal DATA is sampled in accordance with the input signal, and the sampled signal is input to a memory cell corresponding to the address Ax or the address Ay.

The row decoder 207 can have a circuit configuration similar to that of the column decoder 208 and a signal for selecting a memory cell corresponding to the address Ay is generated in the row decoder 207. The amplitude of the signal is adjusted by the level shifter, and then the processed signal is input to the memory cell array 201 through the buffer.

The driver circuit 202, the row decoder 207, and the column decoder 208 in FIG. 12A need to operate at high speed for writing signals to a bit line and a word line of the memory cell array 201. In view of this, transistors having high field-effect mobility, such as the transistors of one embodiment of the present invention, are used in the driver circuit 202, the row decoder 207, and the column decoder 208; accordingly, high-speed operation of the memory device is possible.

Next, a configuration of the memory cell array 201 will be described with reference to FIGS. 13A and 13B.

Figure 13A:
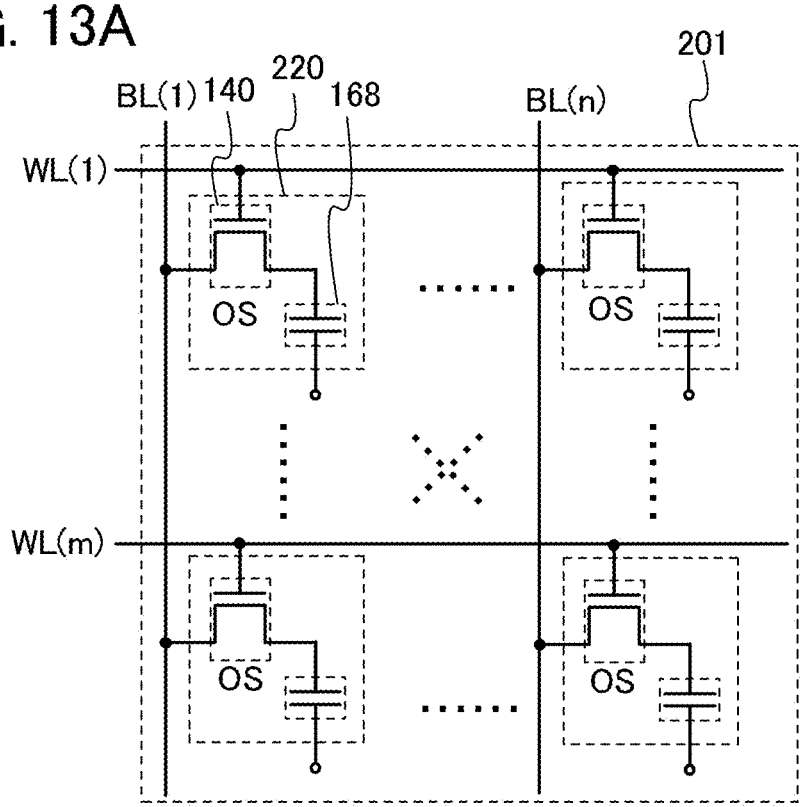
FIGS. 13A and 13B illustrate a semiconductor device of one embodiment.

FIG. 13A illustrates a memory cell array in a memory device whose structure corresponds to that of a so-called DRAM (dynamic random access memory). A memory cell array 201 illustrated in FIG. 13A has a configuration in which a plurality of memory cells is arranged in a matrix. Further, the memory cell array 201 includes m bit lines BL and n word lines WL.

Figure 13B:
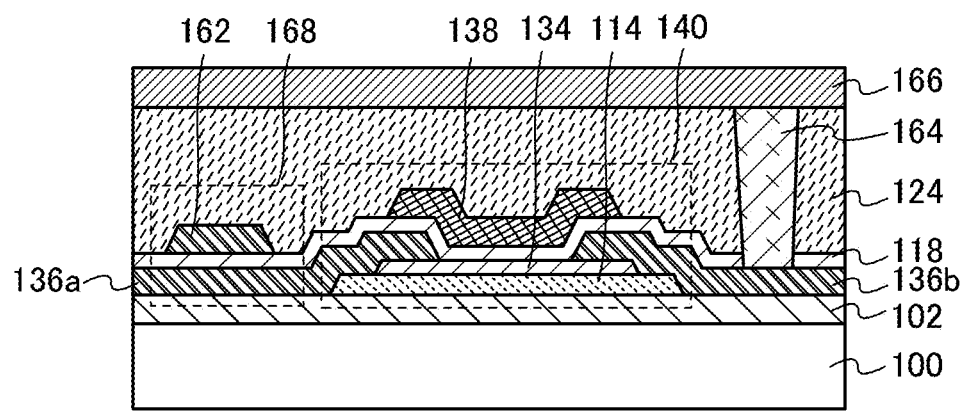

The memory cell 220 in FIGS. 13A and 13B includes the transistor 140 and a capacitor 168. The transistor described in Embodiment 2 is used as the transistor 140. Although a description will be given referring to the transistor 140 described in Embodiment 2, any of the transistors described in the other embodiments may be used.

The gate electrode 138 of the transistor 140 is electrically connected to a word line WL. The source electrode 136a or the drain electrode 136b of the transistor 140 is electrically connected to the bit line BL (corresponding to an electrode 164 and a wiring 166), and the drain electrode 136b or the source electrode 136a of the transistor 140 is electrically connected to one of electrodes (corresponding to the source electrode 136a) of the capacitor 168. The other electrode (corresponding to an electrode 162) of the capacitor 168 is electrically connected to a capacitor line and is supplied with a predetermined potential.

As illustrated in FIG. 13B, the insulating film 124 is provided over the transistor 140 and the capacitor 168. Further, the electrode 164 is provided in a contact hole formed in the insulating film 124 and the gate insulating film 118, and the wiring 166 connected to the electrode 164 is formed over the insulating film 124. The wiring 166 electrically connects one memory cell to another memory cell.

The off-state current of the transistor of one embodiment of the present invention is significantly low; thus, when this transistor is used as the transistor 140 included in the memory cell 220 as appropriate, data written to the capacitor 168 can be held for a long time and the memory device can be used as a substantially non-volatile memory device.

Although FIGS. 13A and 13B illustrate the DRAM as the memory device, a static random access memory (SRAM) and other memory devices can also made using a memory element formed using any of the transistors of one embodiment of the present invention.

The structures, methods, and the like which are described in this embodiment can be combined as appropriate with any of the structures, methods, and the like which are described in the other embodiments.

Embodiment 7

The semiconductor device of one embodiment of the present invention can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the semiconductor device described in the above embodiment will be described.

Figure 14A:
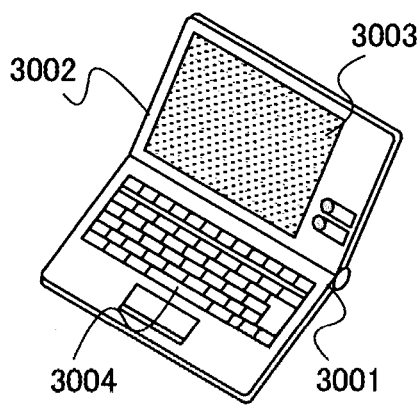
FIGS. 14A to 14F illustrate electronic devices.

FIG. 14A illustrates a laptop personal computer which includes a main body 3001, a housing 3002, a display portion 3003, a keyboard 3004, and the like. The display device described in Embodiment 5 can be used for the display portion 3003. Further, it is possible to use the memory device described in Embodiment 6 for an arithmetic circuit, a wireless circuit, or a memory circuit in the main body which are not illustrated. The use of the semiconductor device of one embodiment of the present invention allows the laptop personal computer to have high performance and operate at high speed.

Figure 14B:
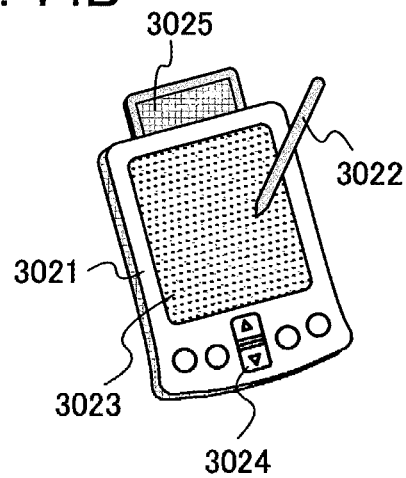

FIG. 14B is a personal digital assistant (PDA) which includes a display portion 3023, an external interface 3025, an operation button 3024, and the like in a main body 3021. A stylus 3022 is an accessory for operation. The display device described in Embodiment 5 can be used for the display portion 3023. Further, it is possible to use the memory device described in Embodiment 6 for an arithmetic circuit, a wireless circuit, or a memory circuit in the main body which are not illustrated. The use of the semiconductor device of one embodiment of the present invention allows the personal digital assistant (PDA) to have high performance and operate at high speed.

Figure 14C:
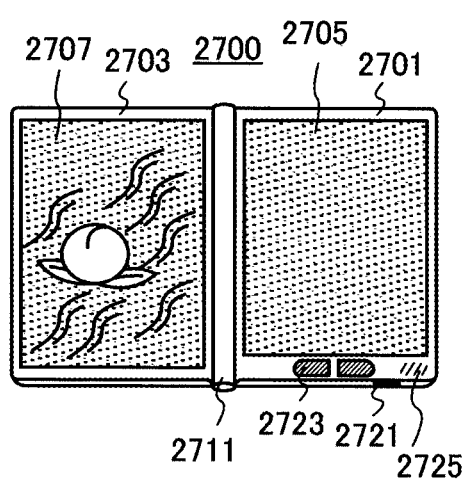

FIG. 14C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. When the display portion 2705 and the display portion 2707 display different images, for example, text can be displayed on a display portion on the right side (the display portion 2705 in FIG. 14C) and graphics can be displayed on a display portion on the left side (the display portion 2707 in FIG. 14C). The display device described in Embodiment 5 can be used for the display portion 2705 and the display portion 2707. Further, it is possible to use the memory device described in Embodiment 6 for an arithmetic circuit, a wireless circuit, or a memory circuit in the main body which are not illustrated. The use of the semiconductor device of one embodiment of the present invention allows the electronic book reader 2700 to have high performance and operate at high speed.

FIG. 14C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 14D:
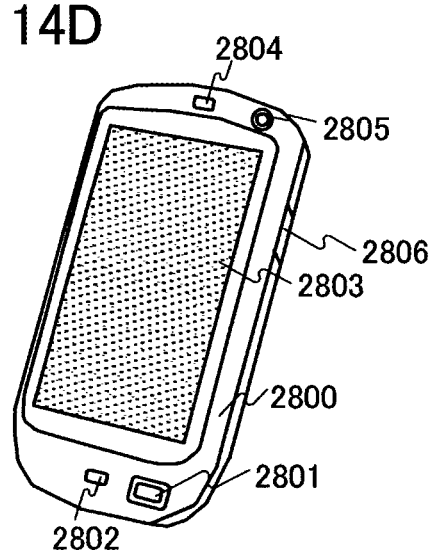

FIG. 14D illustrates a smartphone which includes a housing 2800, a button 2801, a microphone 2802, a display portion 2803 provided with a touch panel, a speaker 2804, and a camera lens 2805 and has a function of a mobile phone. The display device described in Embodiment 5 can be used for the display portion 2803. Further, it is possible to use the memory device described in Embodiment 6 for an arithmetic circuit, a wireless circuit, or a memory circuit in the main body which are not illustrated. The use of the semiconductor device of one embodiment of the present invention allows the smartphone to have high performance and operate at high speed.

In the display portion 2803, the display orientation can be appropriately changed depending on a usage pattern. Further, the camera lens 2805 is provided on the same surface as the display portion 2803, and thus the smartphone can be used as a video phone. The speaker 2804 and the microphone 2802 can be used for videophone calls, recording and playing sound, and the like as well as voice calls.

An external connection terminal 2806 can be connected to an AC adapter and various types of cables such as a USB cable, and charging and data communication with a personal computer or the like are possible. Moreover, a larger amount of data can be stored in a storage medium inserted into an external memory slot (not illustrated) and can be moved.

Further, in addition to the above functions, an infrared communication function, a television reception function, or the like may be provided.

Figure 14E:
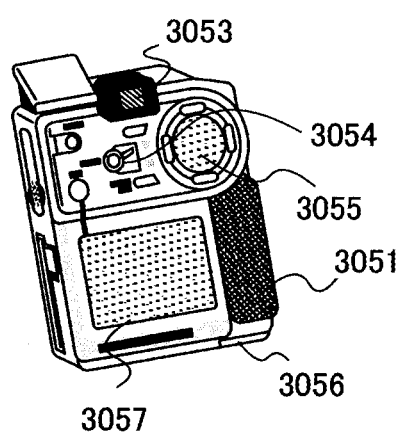

FIG. 14E illustrates a digital video camera which includes a main body 3051, a display portion A 3057, an eyepiece 3053, an operation switch 3054, a display portion B 3055, a battery 3056, and the like. The display device described in Embodiment 5 can be used for the display portion A 3057 and the display portion B 3055. Further, it is possible to use the memory device described in Embodiment 6 for an arithmetic circuit, a wireless circuit, or a memory circuit in the main body which are not illustrated. The use of the semiconductor device of one embodiment of the present invention allows the digital video camera to have high performance and operate at high speed.

Figure 14F:
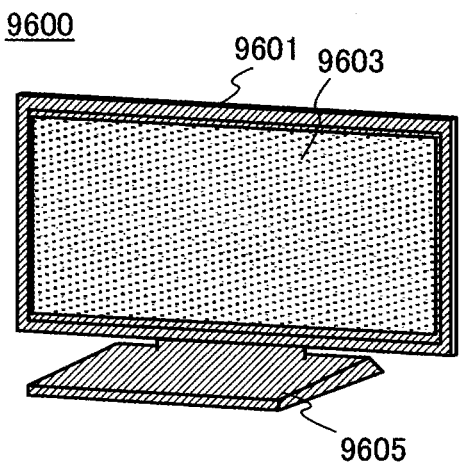

FIG. 14F illustrates an example of a television set. In a television set 9600, a display portion 9603 is incorporated in a housing 9601. The display portion 9603 can display images. Here, the housing 9601 is supported by a stand 9605. The display device described in Embodiment 5 can be used for the display portion 9603. Further, it is possible to use the memory device described in Embodiment 6 for an arithmetic circuit, a wireless circuit, or a memory circuit in the main body which are not illustrated. The use of the semiconductor device of one embodiment of the present invention allows the television set 9600 to have high performance and operate at high speed.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

Example

In this example, a description will be given of an observation result of a cross-sectional structure of a sample (sample A) formed in such a manner that an amorphous silicon film as a film of a semiconductor other than an oxide semiconductor and a silicon oxide film were stacked over an oxide semiconductor film, and heat treatment was performed. A description will also be given of an observation result of a cross-sectional structure of a sample (comparative sample B) formed in such a manner that an amorphous silicon film and a silicon oxide film were stacked over an oxide semiconductor film.

First, the sample A was formed by stacking an IGZO film with a thickness of 10 nm as an oxide semiconductor film, an amorphous silicon film with a thickness of 3 nm, and a silicon oxide film with a thickness of 30 nm over a quartz substrate. The IGZO film was formed by a sputtering method using a target with an atomic ratio of In:Ga:Zn=1:1:1 at a substrate temperature of 300° C. in an oxygen atmosphere (proportion of oxygen: 100%). The amorphous silicon film was formed by a sputtering method using a silicon target as a target at a substrate temperature of 30° C. The silicon oxide film was formed by a sputtering method in an argon atmosphere.

Then, heat treatment was performed on the sample A at 650° C. in an oxygen atmosphere for an hour. Through the above steps, the sample A was formed.

The comparative sample B was formed in the same manner as the sample A except that heat treatment was not performed.

Figure 15A:
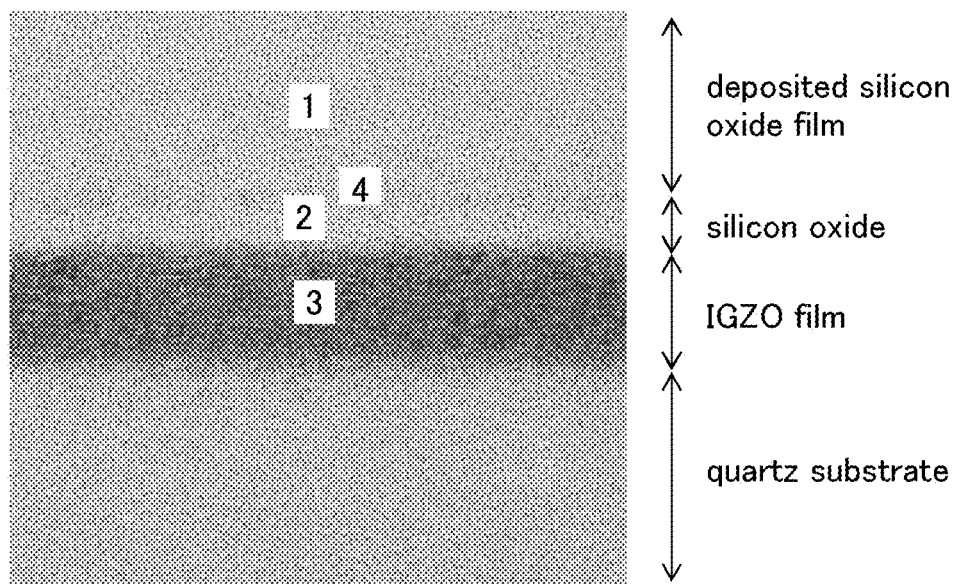
FIGS. 15A and 15B are a TEM image of a sample A and a TEM image of a comparative sample B, respectively.
Figure 15B:
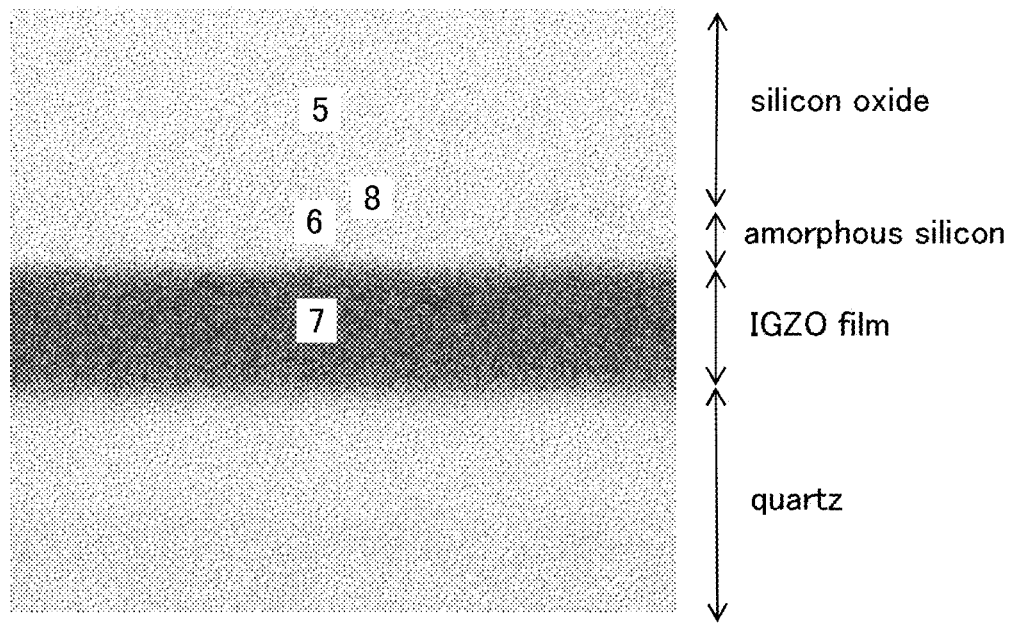

After that, portions including cross sections desired to be observed were cut out of the sample A and the comparative sample B and the cross-sectional views of the sample A and the comparative sample B were observed with a high-resolution transmission electron microscope (TEM) (H9000-NAR manufactured by Hitachi High-Technologies Corporation) with an acceleration voltage of 300 kV. FIGS. 15A and 15B show TEM images of the sample A and the comparative sample B, respectively.

The TEM image of the sample A in FIG. 15A has a region shown by a dark color between a region where the amorphous silicon film was formed and a region where the silicon oxide film was formed. On the other hand, the TEM image of the comparative sample B in FIG. 15B does not have such a region shown by a dark color between a region where the amorphous silicon film was formed and a region where the silicon oxide film was formed.

Then, the compositions of measurement regions 1 to 4 in the TEM image in FIG. 15A and measurement regions 5 to 8 in the TEM image in FIG. 15B were analyzed by energy dispersive x-ray spectroscopy (EDX).

In FIG. 15A, the measurement region 1 corresponds to the deposited silicon oxide film; the measurement region 2 corresponds to a silicon oxide film formed by oxidation of the amorphous silicon film; the measurement region 3 corresponds to the IGZO film; and the measurement region 4 corresponds to an interface between the deposited silicon oxide film and the silicon oxide film formed by oxidation of the amorphous silicon film.

In FIG. 15B, the measurement region 5 corresponds to the deposited silicon oxide film; the measurement region 6 corresponds to the amorphous silicon film; the measurement region 7 corresponds to the IGZO film; and the measurement region 8 corresponds to an interface between the deposited silicon oxide film and the amorphous silicon film.

FIGS. 16A and 16B and FIGS. 17A and 17B show composition analysis results of the measurement regions 1 to 4. FIGS. 18A and 18B and FIGS. 19A and 19B show composition analysis results of the measurement regions 5 to 8. Further, in FIGS. 16A and 16B, FIGS. 17A and 17B, FIGS. 18A and 18B, and FIGS. 19A and 19B, the horizontal axis represents energy (keV) of characteristic X-rays and the vertical axis represents counts.

Figure 16A:
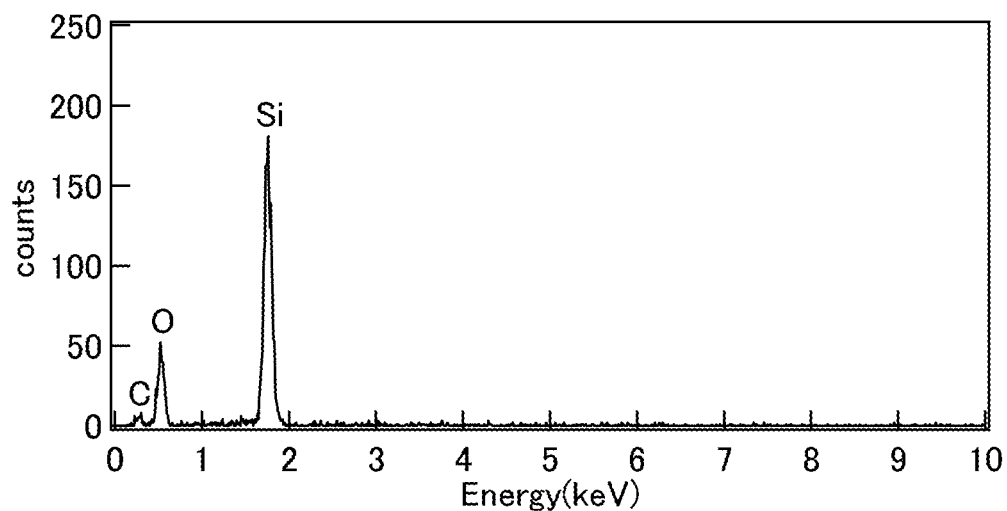
FIGS. 16A and 16B show a composition analysis result of a measurement region 1 and a composition analysis result of a measurement region 2, respectively.
Figure 16B:
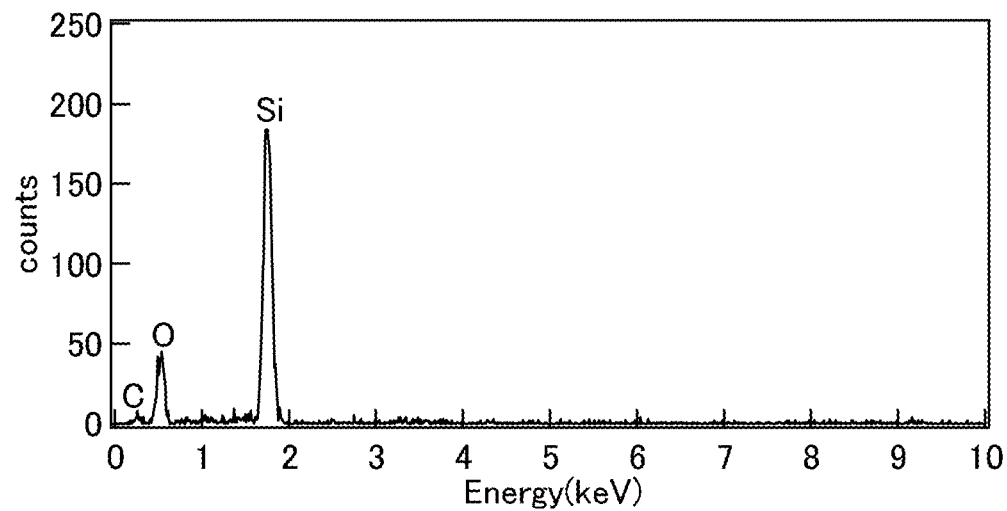
Figure 17A:
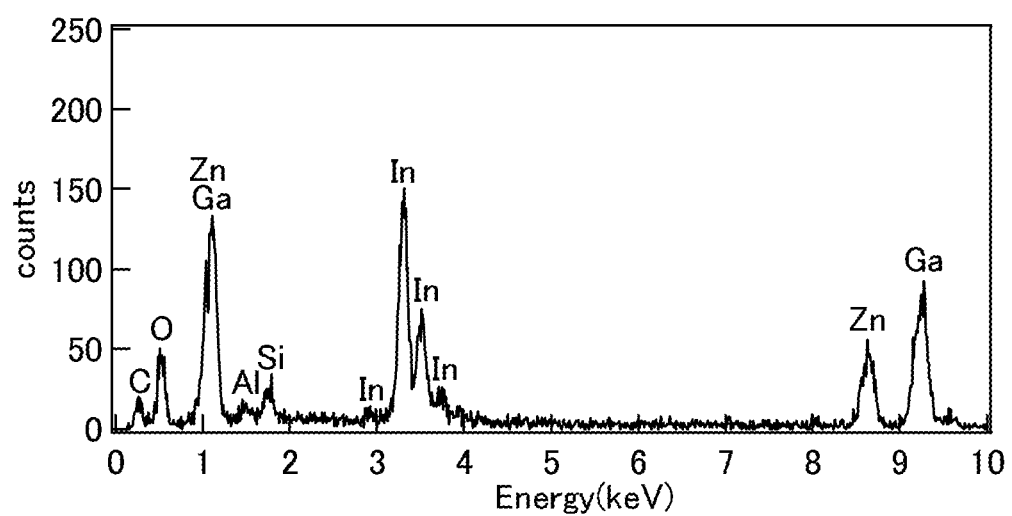
FIGS. 17A and 17B show a composition analysis result of a measurement region 3 and a composition analysis result of a measurement region 4, respectively.
Figure 18A:
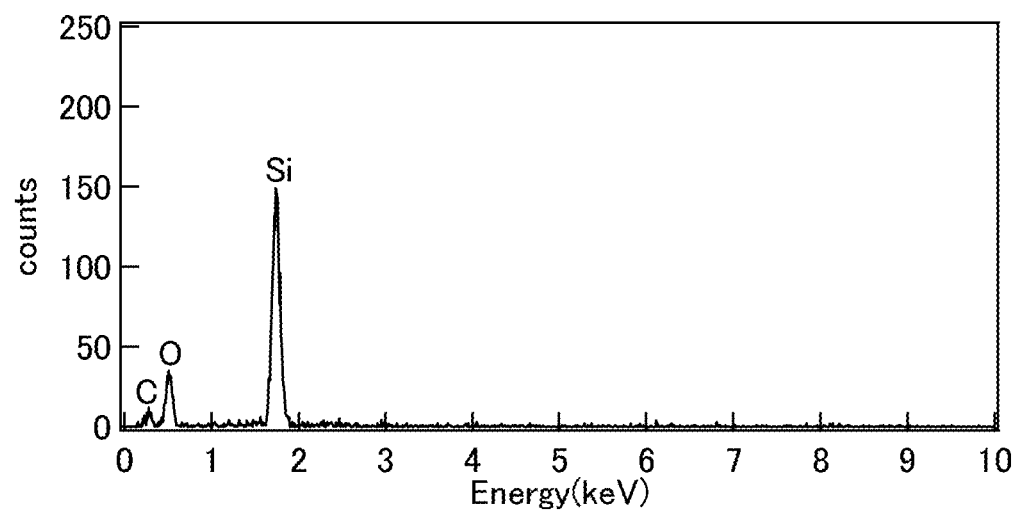
FIGS. 18A and 18B show a composition analysis result of a measurement region 5 and a composition analysis result of a measurement region 6, respectively.
Figure 18B:
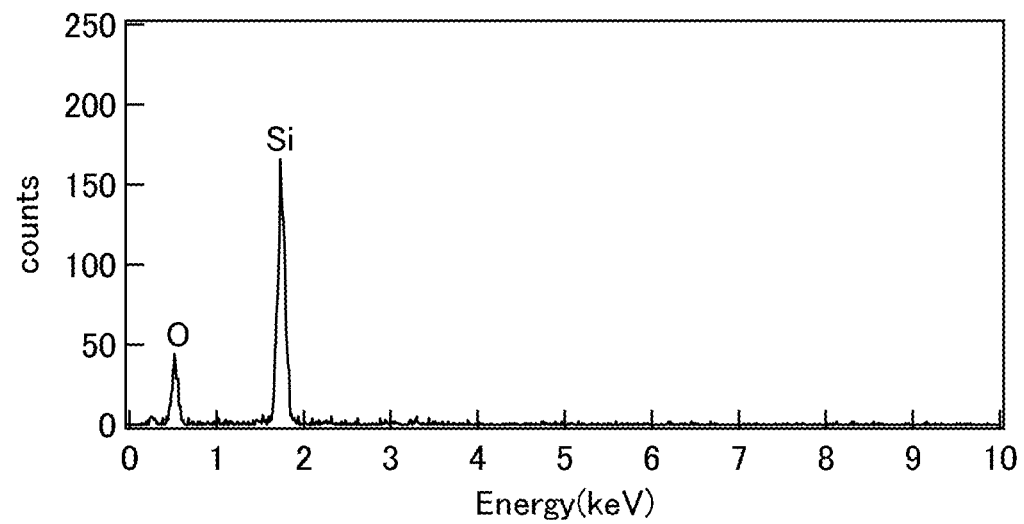
Figure 19A:
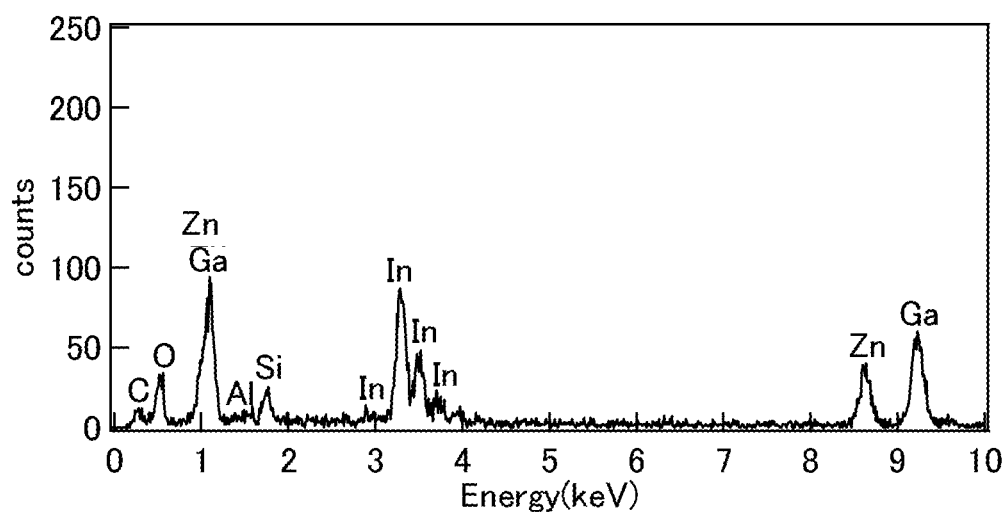
FIGS. 19A and 19B show a composition analysis result of a measurement region 7 and a composition analysis result of a measurement region 8, respectively.

As shown in FIG. 16A, the spectrum of the measurement region 1 has mainly peaks of oxygen and silicon. As shown in FIG. 16B, the spectrum of the measurement region 2 has mainly peaks of oxygen and silicon. As shown in FIG. 17A, the spectrum of the measurement region 3 has mainly peaks of indium, gallium, zinc, and oxygen. As shown in FIG. 18A, the spectrum of the measurement region 5 has mainly peaks of oxygen and silicon. As shown in FIG. 18B, the spectrum of the measurement region 6 has mainly peaks of oxygen and silicon. As shown in FIG. 19A, the spectrum of the measurement region 7 has mainly peaks of indium, gallium, zinc, and oxygen.

Note that the peak of oxygen in FIG. 16B is higher than the peak of oxygen in FIG. 18B.

Figure 17B:
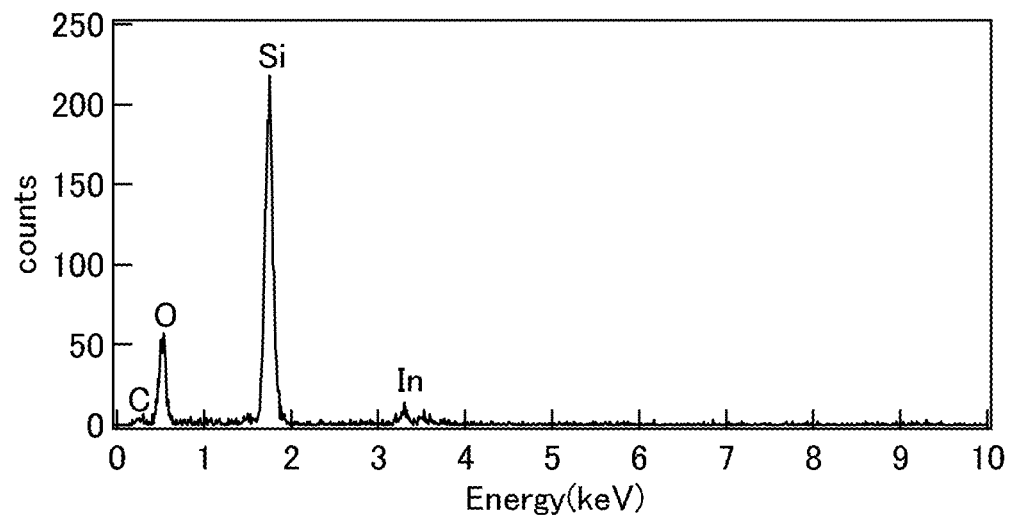
Figure 19B:
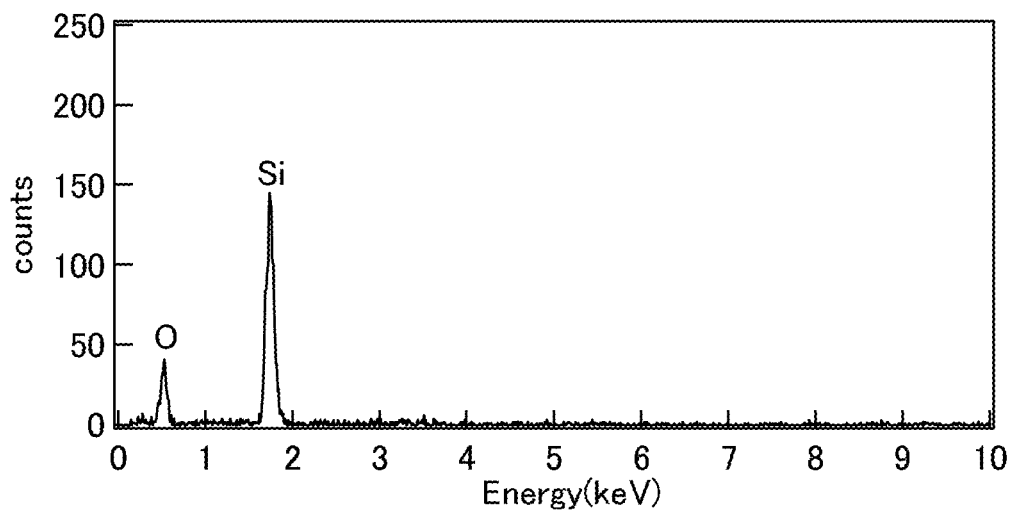

Further, as shown in FIG. 17B, the spectrum of the measurement region 4 in the sample A subjected to the heat treatment has a peak of indium in addition to peaks of oxygen and silicon. On the other hand, as shown in FIG. 19B, the spectrum of the measurement region 8 in the comparative sample B not subjected to heat treatment does not have a peak of indium.

According to the result shown in FIG. 17B, indium contained in the silicon oxide film in contact with the oxide semiconductor film presumably led to formation of a mixed region. The result also suggests that not only oxygen but also an oxygen atom bonded to a metal atom was released from the oxide semiconductor film to be diffused into the amorphous silicon film.

This application is based on Japanese Patent Application serial no. 2011-221195 filed with the Japan Patent Office on Oct. 5, 2011, the entire contents of which are hereby incorporated by reference.

What is claimed is:

1. A method for manufacturing a semiconductor device comprising the steps of:
   forming an oxide semiconductor film;
   forming a metal film over the oxide semiconductor film;
   forming a metal oxide film over the oxide semiconductor film by diffusing oxygen from the oxide semiconductor film to the metal film;
   forming a gate insulating film over the metal oxide film;
   forming a gate electrode over the gate insulating film;
   adding a dopant to the oxide semiconductor film to form a first region and a pair of second regions of the oxide semiconductor film; and
   performing a first heat treatment on the oxide semiconductor film at a temperature higher than or equal to 150° C. and lower than or equal to 450° C. after forming the first region and the pair of second regions,
   wherein the gate electrode overlaps with the first region,
   wherein the first region is located between the pair of second regions,
   wherein the pair of second regions comprise the dopant, wherein the temperature of the first heat treatment is gradually increased from 250° C. to 325° C., wherein a mixed region is provided between the metal oxide film and the oxide semiconductor film, and wherein an element of the oxide semiconductor film and an element of the metal oxide film are mixed in the mixed region.

2. The method for manufacturing a semiconductor device according to claim 1, wherein the metal film comprises any one of aluminum, zirconium, hafnium, and tantalum.

3. The method for manufacturing a semiconductor device according to claim 1, further comprising the step of performing a second heat treatment on the metal film just after the metal film is formed.

4. The method for manufacturing a semiconductor device according to claim 1, wherein a thickness of the mixed region is greater than or equal to 2 nm and less than or equal to 5 nm.

5. The method for manufacturing a semiconductor device according to claim 1, wherein the mixed region contains one or more elements selected from In, Ga, Sn, and Zn.

6. The method for manufacturing a semiconductor device according to claim 1, wherein a conductivity of the pair of second regions is higher than or equal to 0.1 S/cm and lower than or equal to 1000 S/cm.

7. The method for manufacturing a semiconductor device according to claim 1, wherein the gate insulating film is in contact with a side surface of the oxide semiconductor film and the metal oxide film.

8. A method for manufacturing a semiconductor device comprising the steps of:
   forming a first insulating film;
   forming an oxide semiconductor film over the first insulating film;
   forming a metal film over the oxide semiconductor film;
   forming a second insulating film over the oxide semiconductor film by diffusing oxygen from the oxide semiconductor film to the metal film using a first heat treatment;
   forming a gate insulating film over the second insulating film;
   forming a gate electrode over the gate insulating film;
   adding a dopant to the oxide semiconductor film to form a first region and a pair of second regions of the oxide semiconductor film; and
   performing a second heat treatment on the oxide semiconductor film at a temperature higher than or equal to 150° C. and lower than or equal to 450° C. after forming the first region and the pair of second regions, wherein the gate electrode overlaps with the first region, wherein the first region is located between the pair of second regions, wherein the pair of second regions comprise the dopant, wherein the temperature of the second heat treatment is gradually increased from 250° C. to 325° C., wherein the second insulating film is a metal oxide film, wherein a mixed region is provided between the second insulating film and the oxide semiconductor film, and wherein an element of the oxide semiconductor film and an element of the second insulating film are mixed in the mixed region.

9. The method for manufacturing a semiconductor device according to claim 8, wherein the metal film comprises any one of aluminum, zirconium, hafnium, and tantalum.

10. The method for manufacturing a semiconductor device according to claim 8, wherein a thickness of the mixed region is greater than or equal to 2 nm and less than or equal to 5 nm.

11. The method for manufacturing a semiconductor device according to claim 8, wherein the mixed region contains one or more elements selected from In, Ga, Sn, and Zn.

12. The method for manufacturing a semiconductor device according to claim 8, wherein a conductivity of the pair of second regions is higher than or equal to 0.1 S/cm and lower than or equal to 1000 S/cm.

13. The method for manufacturing a semiconductor device according to claim 8, wherein the gate insulating film is in contact with a side surface of the oxide semiconductor film and the second insulating film.

14. The method for manufacturing a semiconductor device according to claim 8, wherein the first insulating film comprises a region which contains oxygen in excess of a stoichiometric composition.

* * * * *